United States Patent
Kuk et al.

(10) Patent No.: US 10,477,737 B2
(45) Date of Patent: Nov. 12, 2019

(54) MANUFACTURING METHOD OF A HOLLOW SHIELDING STRUCTURE FOR CIRCUIT ELEMENTS

(71) Applicant: Samsung Electronics Co., Ltd., Suwon-si, Gyeonggi-do (KR)

(72) Inventors: Keon Kuk, Yongin-si (KR); Il-ju Mun, Suwon-si (KR); Ji-woon Yeom, Suwon-si (KR); Yeon-kyoung Jung, Seoul (KR); Kyong-il Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/386,823

(22) Filed: Dec. 21, 2016

(65) Prior Publication Data

US 2017/0325365 A1 Nov. 9, 2017

Related U.S. Application Data

(60) Provisional application No. 62/331,630, filed on May 4, 2016.

(30) Foreign Application Priority Data

Aug. 25, 2016 (KR) .................. 10-2016-0108435

(51) Int. Cl.
*H05K 3/36* (2006.01)
*H05K 9/00* (2006.01)
(Continued)

(52) U.S. Cl.
CPC ............. *H05K 9/0022* (2013.01); *H05K 3/30* (2013.01); *H05K 9/0032* (2013.01);
(Continued)

(58) Field of Classification Search
CPC ................ H05K 9/0022; H05K 3/30; H05K 2201/10371; Y10T 29/49126; Y10T 29/4913; Y10T 29/49131
(Continued)

(56) References Cited

U.S. PATENT DOCUMENTS

| 5,436,203 A | 7/1995 | Lin |
| 5,641,438 A * | 6/1997 | Bunyan ................. F16J 15/064 264/40.7 |

(Continued)

FOREIGN PATENT DOCUMENTS

| CN | 101785097 A | 7/2010 |
| EP | 2187435 A1 | 5/2010 |

(Continued)

OTHER PUBLICATIONS

Kim et al.; Onset condition of pulsating cone-jet mode of electrohydrodynamic jetting for plane, hole, and pin type electrodes; Journal of Applied Physics; Introducing Invited Perspectives; Ultrafast magnetism and THz spitronics; Nov. 24, 2010; vol. 108; American Institute of Physics; Seoul, KR.

(Continued)

*Primary Examiner* — Donghai D Nguyen
(74) *Attorney, Agent, or Firm* — Jefferson IP Law, LLP

(57) ABSTRACT

A hollow shielding structure for different types of circuit elements is provided. The hollow shielding structure includes at least one element mounted on a printed circuit board (PCB), a shield dam surrounding the at least one element, and a shield cover is configured to be electrically coupled to an upper portion of the shield dam and cover the at least one element, with a gap formed between the at least one element and the shield cover.

3 Claims, 34 Drawing Sheets

(51) Int. Cl.
*H05K 3/30* (2006.01)
*H05K 1/02* (2006.01)

(52) U.S. Cl.
CPC ............ *H01L 2224/16225* (2013.01); *H01L 2224/32225* (2013.01); *H01L 2224/73204* (2013.01); *H01L 2924/19105* (2013.01); *H05K 1/0216* (2013.01); *H05K 2201/10371* (2013.01); *H05K 2201/2018* (2013.01); *Y10T 29/49126* (2015.01)

(58) Field of Classification Search
USPC .......... 29/830, 832, 833; 264/40.7; 174/377
See application file for complete search history.

(56) References Cited

U.S. PATENT DOCUMENTS

| | | | |
|---|---|---|---|
| 5,650,659 | A | 7/1997 | Mostafazadeh et al. |
| 5,761,053 | A * | 6/1998 | King ................. H01L 23/552 174/377 |
| 6,092,281 | A | 7/2000 | Glenn |
| 6,150,193 | A | 11/2000 | Glenn |
| 6,263,564 | B1 * | 7/2001 | Holmberg .............. H05K 3/325 29/832 |
| 6,297,551 | B1 | 10/2001 | Dudderar et al. |
| 6,466,174 | B2 | 10/2002 | Haussler et al. |
| 6,601,293 | B1 | 8/2003 | Glenn |
| 6,933,894 | B2 | 8/2005 | Ghosh et al. |
| 6,962,829 | B2 | 11/2005 | Glenn et al. |
| 7,015,869 | B2 | 3/2006 | Marlow et al. |
| 7,141,869 | B2 | 11/2006 | Kim et al. |
| 7,196,275 | B2 | 3/2007 | Babb et al. |
| 7,311,937 | B2 | 12/2007 | Hashimoto |
| 7,482,686 | B2 | 1/2009 | Zhao et al. |
| 7,633,015 | B2 | 12/2009 | Wurzel et al. |
| 7,752,751 | B2 | 7/2010 | Kapusta et al. |
| 7,981,730 | B2 | 7/2011 | Tang et al. |
| 8,071,893 | B2 | 12/2011 | Lin et al. |
| 8,276,268 | B2 | 10/2012 | Kapusta et al. |
| 8,314,485 | B2 | 11/2012 | Ono et al. |
| 8,633,403 | B2 | 1/2014 | Lin et al. |
| 8,881,387 | B2 | 11/2014 | Lin et al. |
| 8,971,553 | B2 | 3/2015 | Takaoka |
| 9,192,057 | B2 | 11/2015 | Malek et al. |
| 9,572,264 | B2 | 2/2017 | Yamamoto et al. |
| 9,640,858 | B1 | 5/2017 | Islam et al. |
| 9,768,154 | B2 | 9/2017 | Tomonari et al. |
| 2001/0033478 | A1 | 10/2001 | Ortiz et al. |
| 2004/0087043 | A1 | 5/2004 | Lee et al. |
| 2004/0231872 | A1 | 11/2004 | Arnold et al. |
| 2005/0045358 | A1 | 3/2005 | Arnold |
| 2005/0280139 | A1 | 12/2005 | Zhao et al. |
| 2007/0030661 | A1 | 2/2007 | Morris et al. |
| 2007/0176281 | A1 | 8/2007 | Kim et al. |
| 2007/0187136 | A1 | 8/2007 | Higashiguchi et al. |
| 2007/0230131 | A1 | 10/2007 | Bunyan et al. |
| 2008/0044744 | A1 | 2/2008 | Yamazaki et al. |
| 2008/0292846 | A1 | 11/2008 | Muranaga |
| 2009/0244876 | A1 | 10/2009 | Li et al. |
| 2009/0244878 | A1 | 10/2009 | Wurzel et al. |
| 2010/0045181 | A1 | 2/2010 | Oh et al. |
| 2010/0188292 | A1 | 7/2010 | Rutfors |
| 2010/0200983 | A1 | 8/2010 | Ono et al. |
| 2010/0230789 | A1 | 9/2010 | Yorita et al. |
| 2010/0327431 | A1 | 12/2010 | Touzelbaev et al. |
| 2011/0006106 | A1 | 1/2011 | Kanryo et al. |
| 2012/0023743 | A1 | 2/2012 | Lin et al. |
| 2012/0104571 | A1 | 5/2012 | Yoo |
| 2012/0218727 | A1 | 8/2012 | Kim |
| 2012/0320558 | A1 | 12/2012 | Foster et al. |
| 2013/0083501 | A1 | 4/2013 | Azzopardi et al. |
| 2013/0114228 | A1 | 5/2013 | Merz et al. |
| 2013/0241039 | A1 | 9/2013 | Choi et al. |
| 2013/0286609 | A1 | 10/2013 | Merz |
| 2014/0002310 | A1 | 1/2014 | Kim |
| 2014/0071634 | A1 | 3/2014 | Pakula et al. |
| 2014/0126157 | A1 | 5/2014 | Sawatari et al. |
| 2014/0160699 | A1 | 6/2014 | Zhang et al. |
| 2014/0198459 | A1 | 7/2014 | Cheng |
| 2014/0271961 | A1 | 9/2014 | Khoshnevis |
| 2015/0016066 | A1 | 1/2015 | Shimamura et al. |
| 2015/0022978 | A1 | 1/2015 | Steuer et al. |
| 2015/0022986 | A1 | 1/2015 | Steuer et al. |
| 2015/0036297 | A1 | 2/2015 | Chen et al. |
| 2015/0043189 | A1 | 2/2015 | Kitazaki et al. |
| 2015/0070851 | A1 | 3/2015 | Kitazaki et al. |
| 2015/0214602 | A1 | 7/2015 | Hobson et al. |
| 2016/0066481 | A1 | 3/2016 | Malek et al. |
| 2016/0066482 | A1 | 3/2016 | Chi et al. |
| 2016/0091575 | A1 | 3/2016 | Yamada et al. |
| 2016/0157392 | A1 | 6/2016 | Happoya |
| 2016/0262292 | A1 | 9/2016 | Kuk et al. |
| 2017/0117615 | A1 | 4/2017 | Choon et al. |
| 2017/0251549 | A1 | 8/2017 | Lee et al. |
| 2017/0295679 | A1 | 10/2017 | Kim et al. |
| 2017/0325365 | A1 | 11/2017 | Kuk et al. |
| 2018/0116078 | A1 | 4/2018 | Mun et al. |

FOREIGN PATENT DOCUMENTS

| | | |
|---|---|---|
| EP | 3 266 043 A1 | 1/2018 |
| JP | 6-283883 A | 10/1994 |
| JP | 2001-251088 A | 9/2001 |
| JP | 2004-048762 A | 2/2004 |
| JP | 2011-124598 A | 6/2011 |
| JP | 2011-146779 A | 7/2011 |
| JP | 2015-065343 A | 4/2015 |
| JP | 2016-111026 A | 6/2016 |
| KR | 10-0321429 B1 | 3/2002 |
| KR | 10-2006-0083770 A | 7/2006 |
| KR | 10-0618085 B1 | 8/2006 |
| KR | 10-0742098 B1 | 7/2007 |
| KR | 10-2010-0064008 A | 6/2010 |
| KR | 10-2012-0127852 A | 11/2012 |
| KR | 10-2014-0111739 A | 9/2014 |
| KR | 10-2014-0132880 A | 11/2014 |
| KR | 10-1579623 B1 | 12/2015 |
| KR | 10-2016-0031572 A | 3/2016 |
| KR | 10-2016-0044953 A | 4/2016 |
| KR | 10-2016-0045336 A | 4/2016 |
| KR | 10-2016-0108117 A | 9/2016 |
| KR | 10-2017-0125690 A | 11/2017 |
| KR | 10-2018-0087551 A | 8/2018 |
| KR | 10-2018-0101831 A | 9/2018 |
| WO | 2004/047510 A2 | 6/2004 |
| WO | 2005/029937 A1 | 3/2005 |
| WO | 2016/144039 A1 | 9/2016 |
| WO | 2017/111956 A1 | 6/2017 |
| WO | 2017/191888 A1 | 11/2017 |

OTHER PUBLICATIONS

Baek et al.; 3D Printing Process for Mass Production of PCB Component; Best Paper Award 2015; Samsung; Seoul, KR.

U.S. Notice of Allowance dated Oct. 5, 2018, issued in U.S. Appl. No. 15/489,190.

International Search Report and Written Opinion dated Oct. 22, 2018, issued in International Application No. PCT/KR2018/007746.

U.S. Non-final Office Action dated Nov. 8, 2018, issued in U.S. Appl. No. 15/488,024.

U.S. Non-final Office Action dated Nov. 29, 2018, issued in U.S. Appl. No. 15/061,233.

International Search Report and Written Opinion dated Dec. 17, 2018, issued in International Application No. PCT/KR2018/010501.

A U.S. Office Action dated Mar. 1, 2019, issued in a counterpart U.S. application, U.S. Appl. No. 16/124,836.

A European Office Action dated Feb. 12, 2019, issued in a counterpart European application, European Application No. 17792791.0-1203/3430877.

(56) References Cited

OTHER PUBLICATIONS

U.S. Office action dated Apr. 10, 2019; issued by the United States Patent and Trademark Office in U.S. Appl. No. 15/488,024.
Chinese Office Action dated Jun. 27, 2019, issued in a counterpart Chinese application No. 201780028105.X.
U.S. Office action dated Jul. 19, 2019; issued by the United States Patent and Trademark Office in U.S. Appl. No. 16/020,286.
U.S. Office action dated Aug. 9, 2019; issued by the United States Patent and Trademark Office in U.S. Appl. No. 15/061,233.
Chinese Office Action dated Jul. 22, 2019, issued in a counterpart Chinese application No. 201680014167.0.

* cited by examiner

MANUFACTURING METHOD OF A HOLLOW SHIELDING STRUCTURE FOR CIRCUIT ELEMENTS

CROSS-REFERENCE TO RELATED APPLICATION(S)

This application claims the benefit under 35 U.S.C. § 119(e) of a U.S. Provisional application filed on May 4, 2016 in the U.S. Patent and Trademark Office and assigned Ser. No. 62/331,630, and under 35 U.S.C. § 119(a) of a Korean patent application filed on Aug. 25, 2016 in the Korean Intellectual Property Office and assigned Serial number 10-2016-0108435, the entire disclosure of each of which is hereby incorporated by reference.

TECHNICAL FIELD

The present disclosure relates to a hollow shielding structure for different types of circuit elements and a manufacturing method thereof. More particularly, the present disclosure relates to a hollow shielding structure for different types of circuit elements which include an electromagnetic wave shielding member capable of simultaneously protecting semiconductor chips or various types of circuit elements from external environments and shielding the elements from electromagnetic waves, and a manufacturing method thereof.

BACKGROUND

In recent years, demands on portable apparatuses have been rapidly increasing in electronic product markets and thus miniaturization and weight reduction of electronic components mounted on the portable apparatuses are increasingly needed. Technology for reducing individual sizes of mounting components and semiconductor package technology for integrating a plurality of individual elements into one package are needed to realize miniaturization and weight reduction of electronic components. For example, semiconductor packages which handle a radio frequency (RF) signal need to be miniaturized, as well as to include various electromagnetic wave shielding structures to realize good electromagnetic interference (EMI) or electromagnetic wave immunity characteristics.

As the related electromagnetic wave shielding structure is applied to semiconductor packages, a structure which covers various types of elements with a shield can formed of a metallic material and press-processed, and a structure which covers all elements with an insulator and includes a shielding layer formed on the insulator are disclosed.

In response to the shield can of the shielding structures in the related art being used, the shield can may be directly soldered to a ground pad of a printed circuit board (PCB). Accordingly, in response to the shield can being separated from the PCB to reuse various circuit elements and the PCB, a ground pad patterned in the PCB may be detached or damaged. Accordingly, it may be difficult to reuse the various circuit elements and the PCB.

In response to the insulator of the shielding structures in the related art being used, the frequency characteristic of the element may be changed due to a difference of a dielectric constant between the insulator and the air. In response to the circuit element package being applied to various products or different models, a structure for RF signal matching or a technical treatment corresponding thereto may be necessary. Accordingly, the use of the circuit element package may be restricted and additional costs according to the structure for RF signal matching or the treatment may be incurred.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a hollow shielding structure for different types of circuit elements without change in a frequency characteristic of an element and a manufacturing method thereof.

Another aspect of the present disclosure is to provide a hollow shielding structure for different types of circuit elements which uses a polymer comprising a metal filler as a shielding material and is formed through high-speed dispensing and a manufacturing method thereof.

Another aspect of the present disclosure is to provide a hollow shielding structure for different types of circuit elements that is reusable by applying an easily reworkable shielding structure and a manufacturing method thereof.

In accordance with an aspect of the present disclosure, a hollow shielding structure for different types of circuit elements is provided. The hollow shielding structure includes a printed circuit board (PCB) on which at least one element is mounted, a shield dam surrounding the element, and a shield cover configured to be electrically coupled to an upper portion of the shield dam, and cover the element, with a gap formed between the element and the shield cover.

In an embodiment of the present disclosure, a step may be formed in a portion of the shield cover. The step may be formed in the portion of the shield cover close to the shield dam. The step may be formed along an edge portion of the shield cover.

In an embodiment of the present disclosure, a height of the shield cover may be smaller than that of the element.

In an embodiment of the present disclosure, the shield dam and the shield cover may be electrically coupled through a conductive adhesion unit.

In an embodiment of the present disclosure, a plurality of slots in which the adhesion unit flows may be formed in the shield cover.

In an embodiment of the present disclosure, a plurality of seating portions including a first portion in contact with the upper portion and a side of the shield dam and a second portion bent from an edge of the first portion may be formed in the shield cover and the plurality of slots may be formed in the plurality of seating portions.

In an embodiment of the present disclosure, the plurality of slots may penetrate the first portion or may simultaneously penetrate the first portion and the second portion.

In an embodiment of the present disclosure, the adhesion unit may be located between the shield dam and the shield cover.

In an embodiment of the present disclosure, the shield cover may be formed of a conductive metal material.

In an embodiment of the present disclosure, the shield cover may include a conductive tape attached to the shield dam and a shape maintenance layer configured to maintain a shape of the conductive tape.

In an embodiment of the present disclosure, at least one air discharge hole may be formed in the shield cover.

In an embodiment of the present disclosure, the shield dam may be formed of a conductive material and may be coupled to a ground pad formed in the PCB.

In an embodiment of the present disclosure, the shield dam may be continuously or discontinuously coupled to the ground pad formed in the PCB.

In an embodiment of the present disclosure, the shield dam may be a shield dam formed through three-dimensional (3D) printing and may have an aspect ratio that a height of a cross section in the shield dam is larger than a width of the cross-section.

In accordance with another aspect of the present disclosure, a hollow shielding structure for different types of circuit elements is provided. The hollow shielding structure includes a PCB on which at least one element is mounted, a shield dam surrounding the element, a shield cover configured to be spaced from a top of the element and covers the element, and an adhesion unit configured to electrically couple the shield dam and the shield cover. In an embodiment of the present disclosure, a step may be formed in the shield cover so that a portion of the shield cover which is in contact with the shield dam is located lower than a remaining portion thereof.

In accordance with another aspect of the present disclosure, a method for manufacturing a circuit element package is provided. The method includes loading a PCB on which different types of circuit elements are mounted into a working position, calibrating a position of a nozzle with respect to the loaded PCB, forming a shield dam on the PCB by discharging a material from the nozzle, placing a shield cover in an upper portion of the shield dam to cover the different types of circuit elements, and forming an adhesion unit which electrically couples the shield dam and the shield cover.

In an embodiment of the present disclosure, the calibrating of the position of the nozzle may include setting a discharge start position of the nozzle by detecting a distortion degree of the PCB on an X-Y plane to a clockwise direction or counterclockwise direction with respect to a preset manufacturing position, and setting a gap between a surface of the PCB and an end portion of the nozzle by detecting a distortion degree of the PCB on the X-Y plane to a Z-direction.

In an embodiment of the present disclosure, the method may further include, after the forming of the adhesion unit, removing the adhesion unit from the shield dam and the shield cover, separating the shield cover from the shield dam, removing the shield dam from the PCB, removing a remaining portion of the shield dam attached to the PCB.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1A:
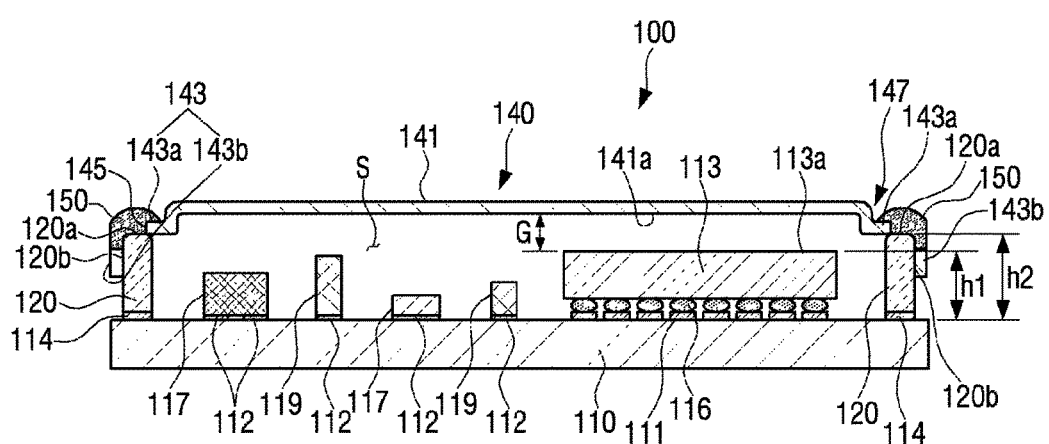
FIG. 1A is a cross-sectional diagram illustrating a hollow shielding structure for different types of circuit elements according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It will be understood that when an element is referred to as being "on" or "in contact with" another element, it can be directly on or in direct contact with the other element or intervening elements may be present. In contrast, when an element is referred to as being "directly on" or "in direct contact with" another element, there are no intervening elements present. Other words used to describe the relationship between elements should be interpreted in a like fashion (e.g., "between" versus "directly between," "adjacent" versus "directly adjacent," etc.).

It will be understood that, although the terms first, second, etc. may be used herein in reference to elements of the present disclosure regardless of an order and/or importance, such elements should not be construed as limited by these terms. The terms are used only to distinguish one element from other elements. For example, without departing from the spirit of the present disclosure, a first element may refer to a second element, and similarly, the second element may refer to the first element.

It will be further understood that the terms "comprises" and/or "comprising," when used in this specification, specify the presence of stated features, integers, operations, elements, components, and/or groups thereof, but do not preclude the presence or addition of one or more other features, integers, operations, elements, components, and/or groups thereof.

Unless otherwise defined, all terms (including technical and scientific terms) used herein have the same meaning as commonly understood by one of ordinary skill in the art to which the present disclosure belongs.

The various embodiments of the present disclosure will be described to exemplify a hollow shielding structure for different types of circuit elements and the element used herein may be an element using a radio frequency (RF) signal.

The element may be an element which employs technology standards or communication method for mobile communication, such as global system for mobile communication (GSM), code division multi access (CDMA), CDMA2000, enhanced voice-data optimized or enhanced voice-data only (EV-DO), wideband CDMA (WCDMA), high speed downlink packet access (HSDPA), high speed uplink packet access (HSUPA), long term evolution (LTE), or LTE-advanced (LTE-A).

The element may be an element which employs wireless internet technology, such as wireless local area network (WLAN), Wi-Fi, Wi-Fi Direct, digital living network alliance (DLNA), wireless broadband (Wi-Bro), or world interoperability for microwave access (WiMAX).

The element may be an element having a function such as short-range communication (Bluetooth™), radio frequency identification (RFID), infrared data association (IrDA), ultra wideband (UWB), ZigBee, near field communication (NFC), Wi-Fi, Wi-Fi Direct, or wireless universal serial bus (USB).

A circuit element package according to an embodiment of the present disclosure may be applied to a smart phone, a display apparatus, a wearable device, and the like.

A hollow shielding structure for different types of circuit elements according to an embodiment of the present disclosure may include an integrated circuit (IC) chip, a passive element, and different types of components mounted on a printed circuit board (PCB) and a shield layer covering the IC chip, the passive element, and the different types of components. For example, the IC chip may be an application processor (AP), a memory, an RF chip, and the like and the passive element may be a resistor, a condenser, a coil, and the like. The different types of components may be a connector, a card socket, an electromagnetic wave shielding component, and the like.

Hereinafter, a hollow shielding structure for different types of circuit elements and a manufacturing method thereof according to an embodiment of the present disclosure will be described in detail with reference to the accompanying drawings.

FIG. 1A is a cross-sectional diagram illustrating a hollow shielding structure for different types of circuit elements according to an embodiment of the present disclosure.

Referring to FIG. 1A, a circuit element package 100, as a hollow shielding structure for different types of circuit elements, may include a PCB 110 and an element 113 and a plurality of circuit elements 117 and 119 mounted on the PCB 110. The plurality of circuit elements may be different types of circuit elements and may include an IC chip, a passive element, and different types of components mounted on the PCB. For example, the IC chip may be an application processor (AP), a memory, an RF chip, and the like and the passive element may be a resistor, a condenser, a coil, and the like. The different types of components may be a connector, a card socket, an electromagnetic wave shield component, and the like.

A first connection pad 111 and a second connection pad 112 to which the element 113 and the plurality of circuit elements 117 and 119 are electrically coupled may be patterned in a top surface of the PCB 110. A plurality of first connection pads 111 and a plurality of second connection pads 112 may be provided. The first and second connection pads 111 and 112 may be formed to ground the element 113 and the plurality of circuit elements 117 and 119 or to transmit signals of the element 113 and the plurality of circuit elements 117 and 119.

A ground pad 114 may be patterned on the top surface of the PCB 110. The ground pad 114 may be formed to ground the element 113 and the plurality of circuit elements 117 and 119 or to transmit signals of the element 113 and the plurality of circuit elements 117 and 119. For example, a shield dam 120 to be described later may be in electrical contact with the ground pad 114, which is formed along a formation route of the shield dam or formed on a portion of the formation route of the shield dam, in response to the shield dam 120 being formed on the PCB 110, and thus the shield dam 120 may be grounded. In this example, the ground pad 114 may be formed in an integral form so that the ground pad 114 may be electrically coupled to a predetermined ground layer (e.g., the ground layer 115" of FIG. 27) formed an inner side of the PCB. The element 113 may include a plurality of connection terminals 116 electrically coupled to the first connection pad 111 of the PCB 110. The plurality of connection terminals 116 may be formed through a ball grid array (BGA) manner such as a solder ball. However, the formation method of the connection terminal 116 is not limited to the BGA manner and the connection terminal 116 may be formed through various manners according to a lead type of the element 113, for example, quad flat no lead (QFN), plastic leaded chip carrier (PLCC), quad flat package (QFP), small outline package (SOP), and thin/shrink/thin shrink SOP (TSOP/SSOP/TSSOP).

Each of the plurality of circuit elements 117 and 119 may include at least one connection terminal (not shown) electrically coupled to the second connection pad 112 of the PCB 110. The plurality of circuit elements 117 and 119 may have a height smaller than or larger than that of the element 113 in response to the plurality of circuit elements 117 and 119 being mounted on the PCB 110. The element 113 and the plurality of circuit elements 117 and 119 may be disposed to be spaced from the shield dam 120 at intervals so as not to be in contact with the shield dam 120.

The hollow shielding structure or circuit element package 100 for different types of circuit elements may include the shield dam 120, a shield cover 140, and an adhesion unit 150 on the PCB 110.

The shield dam 120, the shield cover 140, and the adhesion unit 150 may be formed of a material having an electromagnetic wave shield characteristic which may prevent electromagnetic interference (EMI). Accordingly, the shield dam 120, the shield cover 140, and the adhesion unit 150 may shield an electromagnetic wave generated from the element 113 and the plurality of circuit elements 117 and 119 to prevent the EMI which affects other electronic components mounted on an electronic apparatus including the circuit element package 100 in advance. The shield dam 120, the shield cover 140, and the adhesion unit 150 may basically interrupt the electromagnetic wave noise or an obstacle such as an abnormal operation to the electronic apparatus including the circuit element package 100 and may prevent reliability of productions from being degraded. A shield layer, for example, the shield dam 120 and the shield cover 140 may prevent the electromagnetic wave noise, which is inevitably generated in an operation process of the circuit element package 100, from affecting to the outside.

In the hollow shielding structure or circuit element package 100 for different types of circuit elements according to an embodiment of the present disclosure, the element 113 which receives and transmits an RF signal may be insulated from the shield dam 120, the shield cover 140, and the adhesion unit 150 through the air. For example, in response to an insulating layer being formed as in the related art, since the dielectric constant of the insulating layer is different from that of the air, the change in the frequency characteristic may be caused. However, in response to the element 113 being insulated from the shield dam 120, the shield cover 140, and the adhesion unit 150 through the air in an embodiment of the present disclosure, the change in the frequency characteristic due to the difference of the dielectric constant may be prevented. Accordingly, the RF signal matching structure may not be necessary for various products employing the hollow shielding structure for different types of circuit elements according to an embodiment of the present disclosure and thus fabrication cost may be reduced.

Figure 1B:
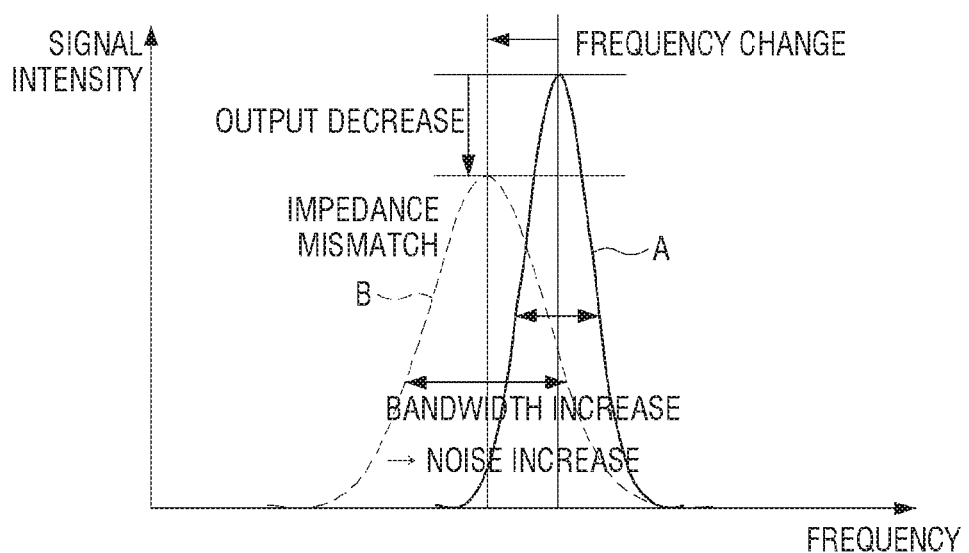
FIG. 1B is a graph explaining change in a frequency characteristic due to a dielectric constant according to an embodiment of the present disclosure.

The frequency characteristic of the RF chip may be affected by parasitic impedance around the RF chip. Accordingly, the designer may design the RF chip so that the intensity of a signal at a specific communication frequency is increased in consideration of impedance affected by a gap between the RF chip and the electromagnetic wave shielding structure and the dielectric constant. Up to now, since the metal shield can is used for a shielding structure, the air may exist between the RF chip and the metal shield can. The dielectric constant in the gap between the RF chip and the meal shield can may be on the basis of the dielectric constant of the air (the dielectric constant of the air is 1). In response to the gap being filled with other materials (for example, a polymer insulating material and the like) other than the air, the dielectric constant (=2.5) may be increased, and the frequency characteristic may be changed from A to B as illustrated in FIG. 1B. Accordingly, the capacities of the resistor and the condenser around the RF chip may be changed to maintain the same frequency characteristic as that in the related art. In response to change range of the capacity being increased, the capacity of the element may be out of a standard capacity range. Since the impedance matching is newly performed on each portable phone to design a plurality of portable phone models, the design complexity may be increased. Accordingly, since the air gap is formed between the shield cover 140 (e.g., a metallic shield cover) and the RF chip (for example, the element 113) in the hollow shielding structure or circuit element package 100 for different types of circuit elements according to an embodiment of the present disclosure, the frequency characteristic may be maintained without change of the related impedance design.

The shield dam 120 may form a lateral surface of the shielding structure and the shield cover 140 may form a top surface of the shielding structure.

The shield dam 120 may be grounded to the ground pad 114 in response to the shield dam 120 being formed and the shield dam 120 may substantially have a closed-loop shape to surround the element 113 and the plurality of circuit elements 117 and 119. For example, the shield dam 120 may be formed in a rectangular shape, but this is not limited thereto. The shield dam 120 may be formed through a three-dimensional (3D)-printable material discharge device (e.g., the material discharge device 200 of FIG. 7). Since the material discharge device 200 is generally lower-priced than the semiconductor equipment of the related art for forming a semiconductor layer, the fabrication cost may be reduced, the shield dam 120 may be formed in a short time, and the required time for the manufacturing process may be shortened.

A height h2 of the shield dam 120 may be formed larger than a height h1 of the element 113 mounted on the PCB 110. To prevent the element 113 from being electrically coupled to the shield cover 140, the height h2 of the shield dam 120 may be set to have a fixed gap G between the element 113 and the shield cover 140.

Figure 2:
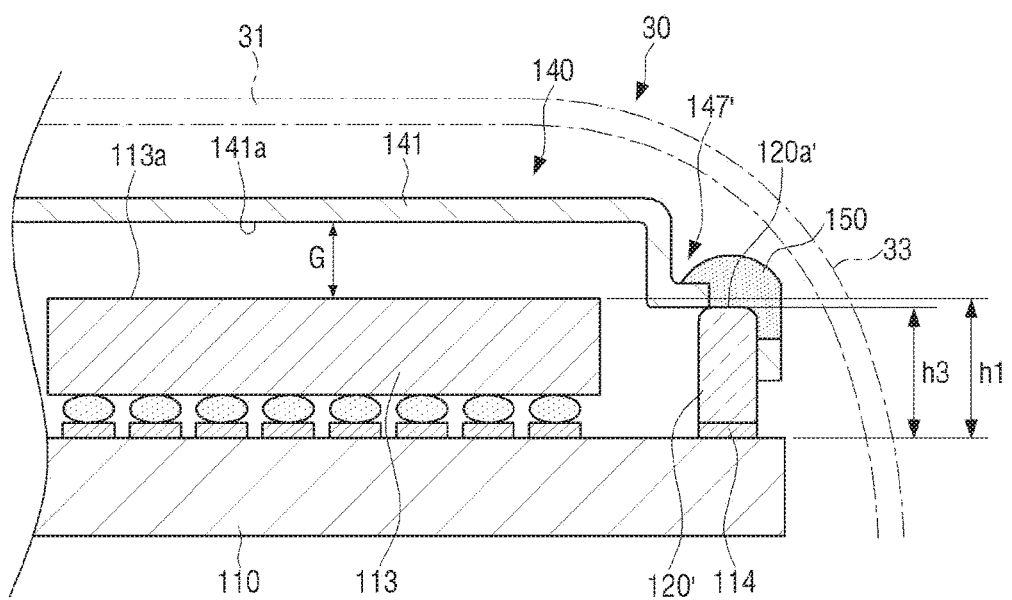
FIG. 2 is a schematic cross-sectional diagram illustrating an example that a height of a shield dam is formed lower than a height of an element mounted on a printed circuit board (PCB) according to an embodiment of the present disclosure.

FIG. 2 is a schematic cross-sectional diagram illustrating an example that a height of a shield dam is formed lower than a height of a wireless communication element mounted on a PCB according to an embodiment of the present disclosure.

Referring to FIG. 2, a height h3 of a shield dam 120' may be formed smaller than a height h1 of an element 113 mounted on the PCB 110. As the height of the shield dam is increased, it may be advantageous on process, but it is not easy to form the shield dam having a high height. Accordingly, the shield dam 120' may be formed to have a lower height and a step 147' may be formed in a shield cover 140 to compensate the lowered height of the shield dam 120'. The elements having a larger height than the shield dam 120' may be covered with the shield cover 140 with a fixed gap through the step 147'. In response to the height h3 of the shield dam 120' being formed smaller than the height h1 of the element 113, the processing time may be shortened.

The step 147' of the shield cover 140 illustrated in FIG. 2 may be formed larger than the step 147 of the shield cover 140 illustrated in FIG. 1A and the electrical contact between the element 113 and the shield cover 140 may be prevented due to a fixed gap G between the element 113 and the shield cover 140.

Through the formation of the step 147' in the shield cover 140, the adhesion unit 150 may not be in contact with neighboring structures by lowering a height of the adhesion unit 150 than the height of a top plate 141 of the shield cover 140 and considering shapes of the neighboring structures. For example, in response to the hollow shielding structure for different types of circuit elements according to an embodiment of the present disclosure as illustrated in FIG. 2 being applied to a portable phone (e.g., the portable phone 410 of FIG. 22), the height of the adhesion unit 150 may be lowered to correspond to an edge portion 33 of a rear cover 30 of the portable phone which is formed lower than a central portion 31 of the rear cover 30. The rear cover 30 of the portable phone may refer to a battery cover. Accordingly, the portable phone may be designed so that the adhesion unit 150 may not be interfered with an inner surface of the rear cover 30. In response to the circuit element package, according to an embodiment of the present disclosure, being applied to various types of small home appliances, the circuit element package may be disposed in harmony with the shapes of the structures around the circuit element package and thus the free degree in the design may be improved and an overall volume of the portable phone may be maintained in a compact size.

In an embodiment of the present disclosure, the shield dams 120 and 120' may be formed so that the heights h2 and h3 are larger than or smaller than the height h1 of the element 113 as illustrated in FIGS. 1A and 2, and thus the fabrication may be flexible and the working efficiency may be improved. The examples that the heights h2 and h3 of the shield dams 120 and 120' are formed larger than or smaller than the height h1 of the element 113 have been described in the various embodiments of the present disclosure, but this is not limited thereto and the heights h2 and h3 may be set equal to the height h1 of the element 113.

The shield cover 140 may be spaced from the elements 113, 117, and 119 to form a fixed gap. An insulating space S in which the air exists may be formed in an inner side of the shield cover 140 and the shield cover 140 may have the fixed gap with the elements using the air as the insulator. The insulating space S may be formed by the PCB 110, the shield dam 120, and the shield cover 140.

The element 113 and the plurality of circuit elements 117 and 119 and the first connection pad 111 and the second connection pad 112 electrically coupled to the elements 113, 117, and 119 may be located in the insulating space S.

Figure 3:
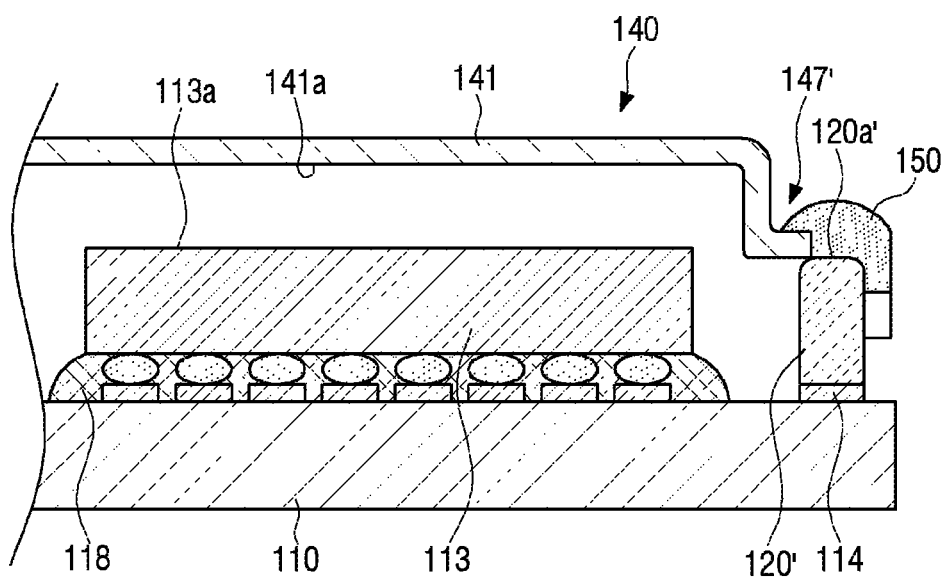
FIG. 3 is a diagram illustrating an example of an underfill treatment being performed between a bottom surface of an element and a top surface of a PCB according to an embodiment of the present disclosure.

FIG. 3 is a diagram illustrating an example of an underfill treatment being performed between a bottom surface of an element and a top surface of a PCB according to an embodiment of the present disclosure.

Referring to FIG. 3, to stably fix the element (for example, the element 113) having a relatively large size among the elements 113, 117, and 119, an underfill formation unit 118 may be located in the insulating space S between the element and the PCB through an underfill process. As described above, various structures other than the underfill formation unit 118 may be located in the insulating space S, but any structure may be formed to have a fixed gap with the shield dam 120 and the shield cover 140 using the air as an insulator.

Figure 4:
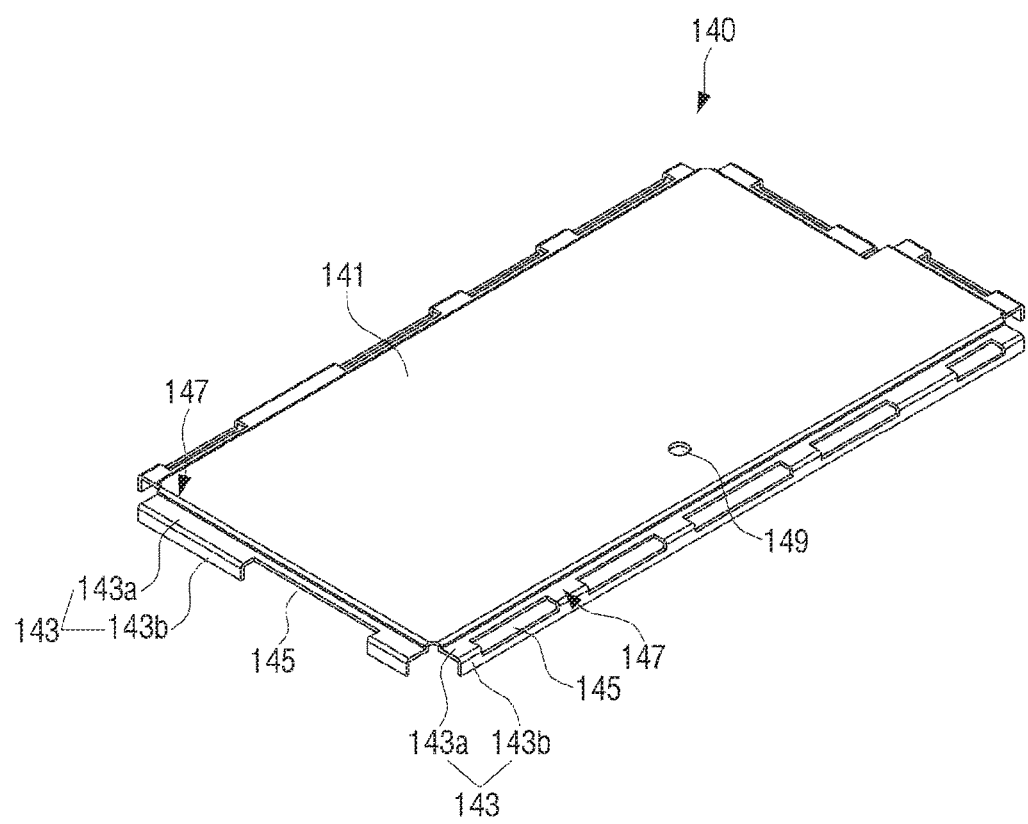
FIG. 4 is a perspective view of a shield cover of FIG. 1A wherein the shield cover includes a plurality of slots, in which an adhesion unit flows, in a contact portion with a shield dam according to an embodiment of the present disclosure.

FIG. 4 is a perspective view of the shield cover illustrated in FIG. 1A wherein the shield cover includes a plurality of slots, in which an adhesion unit flows, in a contact portion with a shield dam according to an embodiment of the present disclosure.

Referring to FIG. 4, the shield cover 140 may be formed of a conductive metal material and may have an area corresponding to a shield region to cover the overall shield region. The shield cover 140 may be formed in a plate form having a fixed thickness and may have stiffness and ensure structural stability.

The shield cover 140 may include a top plate 141 and a seating portion 143 formed along a border of the top plate 141.

The top plate 141 may be substantially flat and may cover an upper portion of the shield region partitioned by the shield dam 120. At least one air discharge hole 149 may be formed in the top plate 141 to discharge the air thermally expanded in the insulating pace S formed by the PCB 110, the shield dam 120, and the shield cover 140.

Figure 5A:
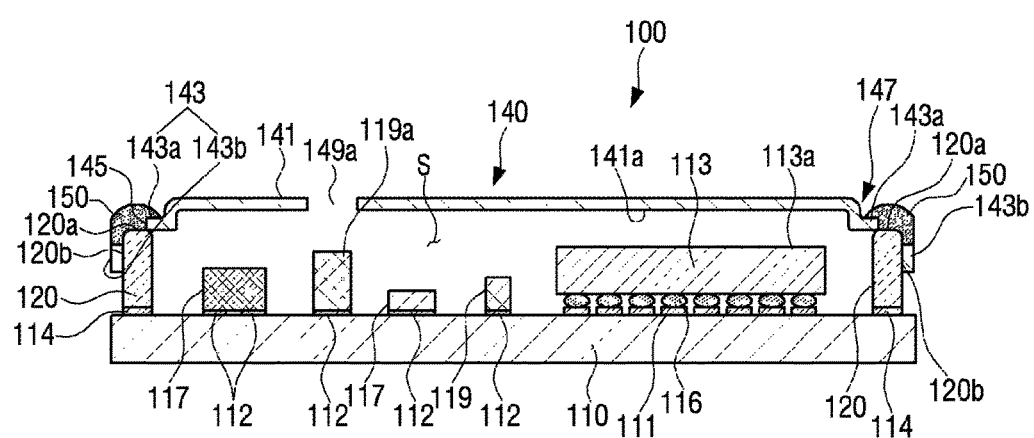
FIG. 5A is a diagram illustrating an example that a hole is formed in a shield cover to prevent frequency interference of an element according to an embodiment of the present disclosure.
Figure 5B:
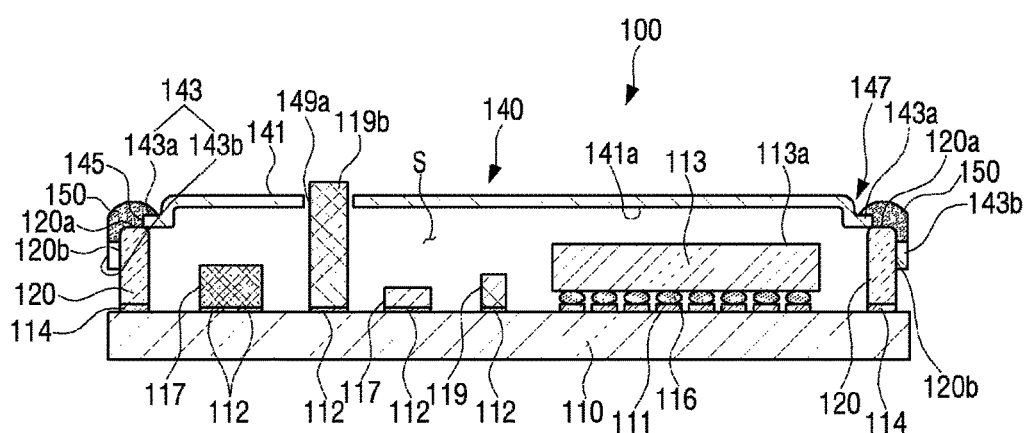
FIGS. 5B and 5C are diagrams illustrating examples that a hole and a step are formed in shield covers in response to a height of an element being larger than those of the shield covers according to various embodiments of the present disclosure.
Figure 5C:
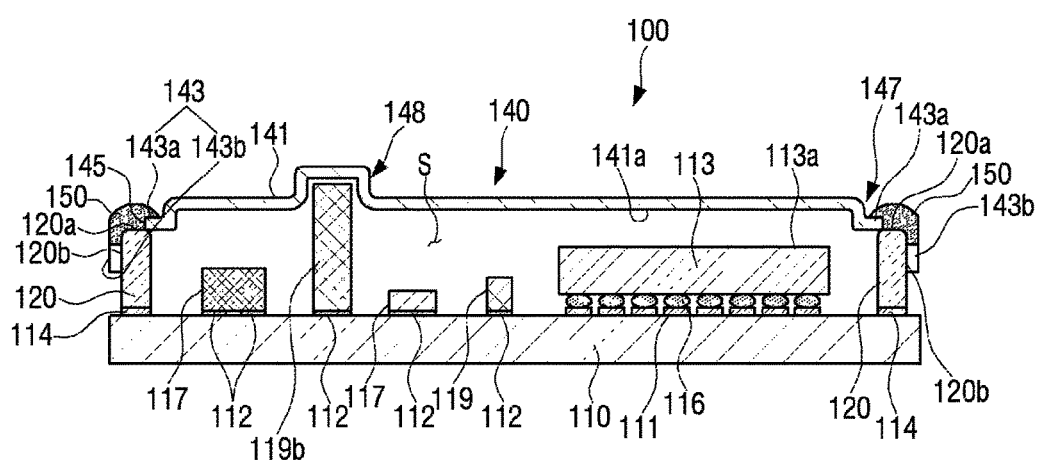

FIG. 5A is a diagram illustrating an example that a hole is formed in a shield cover to prevent frequency interference of an element according to an embodiment of the present disclosure, and FIGS. 5B and 5C are diagrams illustrating examples that a hole and a step are formed in shield covers in response to a height of an element being larger than those of the shield covers according to various embodiments of the present disclosure.

Other holes for other purposes other than air discharge may be formed in the shield cover 140. For example, referring to FIG. 5A, a hole 149a having a fixed area may be formed in a portion of the top plate 141 of the shield cover 140 corresponding to a position of an element 119a (for example, an oscillator) to prevent change in the frequency characteristic due to undesired capacitance generated between the element 119a and the shield cover 140.

In response to a height of an element 119b used in a shield region being larger than that of the top plate 141 of the shield cover 140 as illustrated in FIG. 5B, a hole 149b may be formed so that the element 119b is not interfered with the top plate 141 of the shield cover 140. Like the element 119b described above, in response to the height of an element 119b being larger than that of the top plate 141 of the shield cover 140, the hole 149b may not be formed and as illustrated in FIG. 5C, the shield cover 140 may be formed to be stepped in a portion of the top plate 141 corresponding to a position of the element 119b as indicated by 148 and to protrude by a fixed height toward the outer side of the shield cover 140. For example, an inner side of the stepped portion 148 may be formed to have a fixed gap with the element 119b using the air as an insulator.

The seating portion 143 may be placed in an upper portion 120a of the shield dam 120, and a step 147 may be formed in the seating portion 143 to have a fixed height difference from the top plate 141. For example, the seating portion 143 may be formed in a position lower than the top plate 141. The top plate 141 and the seating portion 143 of the shield cover 140 may be formed to have the step 147 and as illustrated in FIGS. 1A and 2, the fixed gap G may be formed between the bottom surface 141a of the top plate 141 and the top surface 113a of the element 113. As the step 147 is formed between the top plate 141 and the seating portion 143 of the shield cover 140, the circuit element package 100 may be manufactured in a compact size. The step 147 may be formed through multi-stage bending and the circuit element package 100 may be more structurally stable than the package having no step.

The seating portion 143 may include a first portion which is in contact with the upper portion 120a of the shield dam 120 and a second portion 143b substantially downwardly bent from an end portion of the first portion 143a. The shield cover 140 may be substantially placed in the shield dam 120 by the first portion 143a. The second portion 143b may be in contact with a side portion 120b of the shield dam 120 as illustrated in FIG. 1A, but this is not limited thereto and the second portion 143b may be spaced from the side portion 120b of the shield dam 120 at a fixed interval.

The shield cover 140 may be electrically coupled to the shield dam 120 by the adhesion unit 150. The adhesion unit 150 formed of a conductive material may be applied in the seating portion 143 of the shield cover 140 and may flow in a plurality of slots 145 formed in the seating portion 143 to be in contact with the shield dam 120. The adhesion unit 150 may be applied to the seating portion 143 and then thermally cured to firmly bond the seating portion 143 and the shield dam 120. Accordingly, the shield cover 140 may be electrically coupled to the shield dam 120 and may be structurally stably fixed to the shield dam 120. In an embodiment of the present disclosure, the adhesion unit 150 may be cured through various methods such as a curing method using ultra-violet (UV), infrared (IR) and a halogen lamp, a natural curing method, or an oven curing method.

The plurality of slots 145 formed in the seating portion 143 may be simultaneously formed in the first portion 143a and the second portion 143b of the seating portion 143. For example, the plurality of slots 145 may be formed to pass through the first portion 143a and the second portion 143b of the seating portion 143 and to include a corner portion in which the first portion 143a and the second portion 143b are in contact with each other. In this example, the plurality of slots 145 may ensure a sufficient area so that the adhesion unit 150 may flow in the plurality of slots in the applying of the adhesion unit 150.

Figure 6:
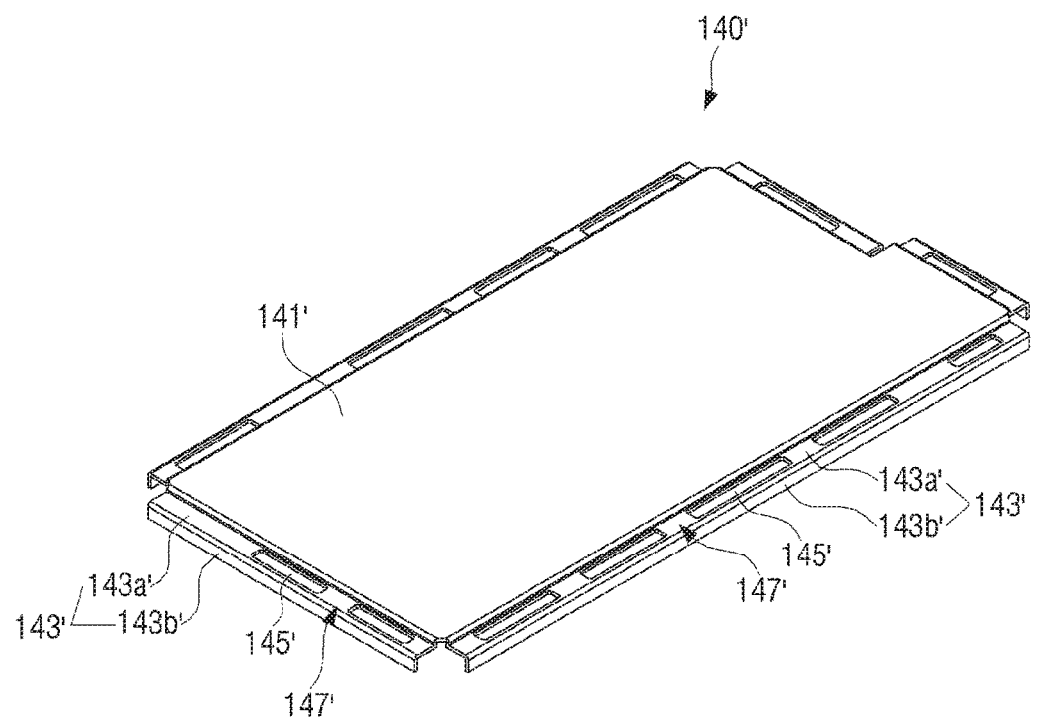
FIG. 6 is a perspective view illustrating another embodiment of the shield cover illustrated in FIG. 4 according to an embodiment of the present disclosure.

FIG. 6 is a perspective view illustrating another example of the shield cover illustrated in FIG. 4 according to an embodiment of the present disclosure.

Referring to FIG. 6, the air discharge hole (e.g., the air discharge hole 149 of FIG. 4) may not be formed in an upper plate 141' of a shield cover 140'. The shield cover 140' may have shielding performance higher than the shield cover 140 including the air discharge hole 149 in the upper plate 141'. However, at least one air discharge hole, which discharges heat generated in various elements according to the driving of the circuit element package 100 to the outside of the shielding structure, may also be formed in the shield cover 140'.

For example, a seating portion 143' of the shield cover 140' may be formed to have a step 147' with the upper plate 141' and a plurality of slots 145' may be formed in the seating portion 143'. In this example, the plurality of slots 145' may be formed only in a first portion 143a' of the seating portion 143' and may not be formed in the second portion 143b'. In response to the plurality of slots 145' being formed only in the first portion 143a' of the seating portion 143', the plurality of slots 145' may be formed to have a size that the applied adhesion unit 150 may smoothly flow in the plurality of slots 145'.

Hereinafter, a method of manufacturing a circuit element package according to an embodiment of the present disclosure will be sequentially described. Before the manufacturing method is described, a configuration of a material discharge device for forming a shield dam and an adhesion unit formed in the circuit element package will be first described.

Figure 7:
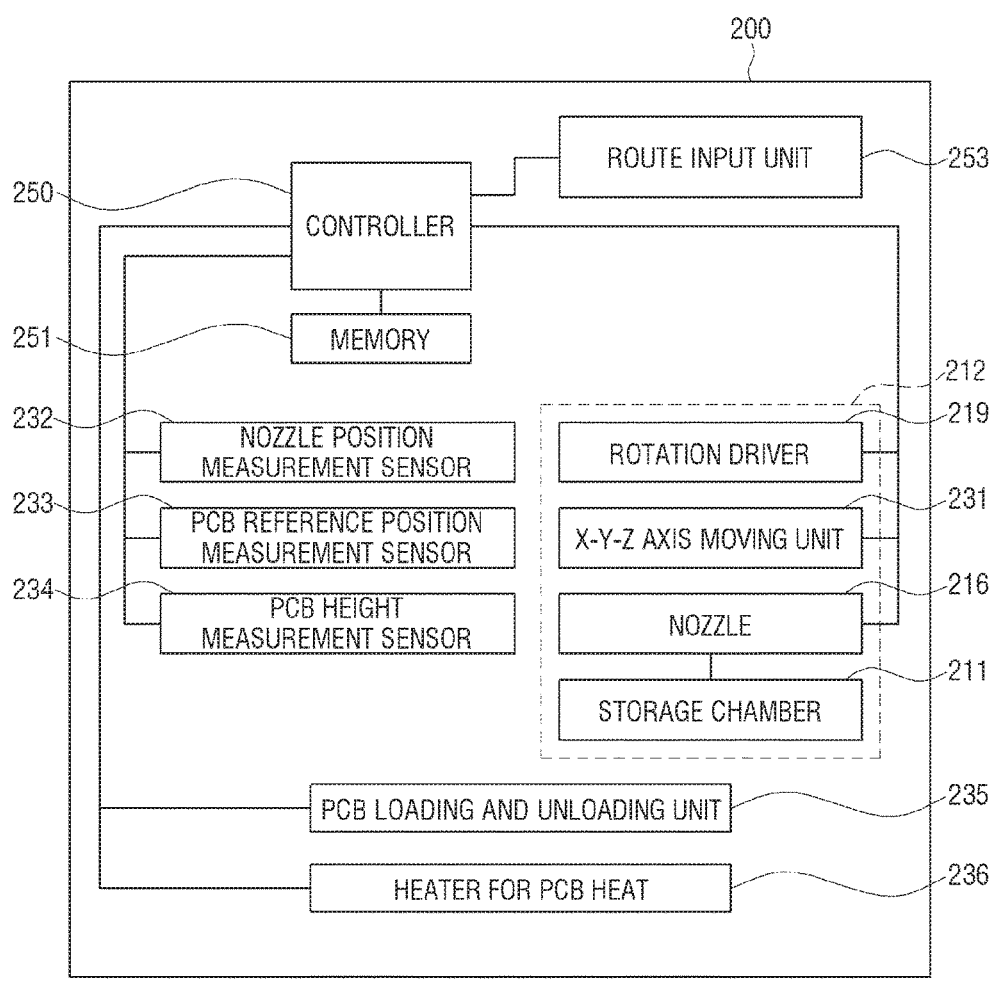
FIG. 7 is a block diagram illustrating a material discharge device for forming a shield dam and an adhesion unit of a hollow shielding structure for different types of circuit elements according to an embodiment of the present disclosure.

FIG. 7 is a block diagram illustrating a material discharge device for forming a shield dam and an adhesion unit of a hollow shielding structure for different types of circuit elements according to an embodiment of the present disclosure. The material discharge device may be a 3D printer.

The example that the material discharge device 200 includes one nozzle 216, but this is not limited thereto and a plurality of nozzles may be provided. For example, a plurality of nozzles having discharge holes having different aspect ratios may be provided to form shield dams 120 having different heights. Even in response to one nozzle being provided, the dams having the different heights may be formed by adjusting a moving speed of the nozzle and a discharge amount of a material.

Referring to FIG. 7, the material discharge device 200 may include a dispenser 212 configured to discharge a fixed amount of material. The dispenser 212 may include a storage chamber 211 configured to store a material and a nozzle 216 configured to discharge the material provided from the storage chamber 211 to outside.

The dispenser 212 may include an X-Y-Z-axis moving unit 231 configured to move the nozzle 216 to X-axis, Y-axis, and Y-axis directions and a rotation driver 219 configured to rotate the nozzle 216 to a clockwise direction or a counterclockwise direction or to stop rotation of the nozzle 216. The X-Y-Z-axis moving unit 231 may include a plurality of step motors (not shown) configured to move the nozzle 216 to the X-axis, Y-axis, and Z-axis directions and may be coupled to a nozzle mounting unit (not shown) on which the nozzle is mounted to transfer driving forces of the step motors to the nozzle 216. The rotation driver 219 may include a motor (not shown) configured to provide rotation power and an encoder (not shown) configured to control a rotation angle of the nozzle 216 by detecting the number of rotation of the motor. The X-Y-Z-axis moving unit 231 and the rotation driver 219 may be electrically coupled to the controller 250 and may be controlled through the controller 250.

The material discharge device 200 may include a route input unit or an input unit 253 configured to directly input a moving route of the nozzle 216 by the user.

The input unit 253 may be configured of a touch screen for touch input or a key pad of the related art. The user may input the moving route of the nozzle through the input unit 253. The nozzle route may be input once and the input nozzle route data may be stored in a memory 251. The nozzle route data may be corrected later. A process of inputting the nozzle route through the input unit 253 will be described below.

First, at least two reference marks indicated on the PCB loaded into a working position may be imaged through a vision camera, a distance between two reference marks may be measured, and images for the reference marks and a distance value between two reference marks may be stored in the memory 251. In response to the PCB being a rectangular shape, two reference marks may be indicated at the upper left and lower right of the PCB. The distance between two reference marks may be substantially represented with a straight-line distance of the PCB in a diagonal direction.

For example, in response to the PCB being loaded into the working position, the user may move the vision camera to a position in which a first reference mark of the upper left is located (for example, on the basis of the center of the first reference mark or a portion of the first reference mark) through front, back, left, and right moving buttons provided in the input unit 253 and then press a storage button provided in the input unit 253. The controller 250 may calculate coordinates X1, Y1, and Z1 of the first reference mark by calculating a distance of the first reference mark spaced from the preset origin (0,0,0) and store the calculated coordinates X1, Y1, and Z1 in the memory. The imaging position of the vision camera which moves together with the nozzle may be offset at a fixed interval from the center of the nozzle. Accordingly, the X1, Y1, and Z1 coordinates of the first reference mark may be calculated through the controller 250 in consideration of the offset value. In response to a shoot button being pressed by the user, the image of the first reference mark may be stored in the memory 251.

Subsequently, the user may move the vision camera to a position in which a second reference mark of the lower right is located (for example, on the basis of the center of the second reference mark or a portion of the second reference mark) through the front, back, left, and right moving buttons provided in the input unit 253 and then press the storage button provided in the input unit 253. The controller 250 may calculate coordinates X2, Y2, and Z2 of the second reference mark by calculating a distance of the second reference mark spaced from the preset origin (0,0,0) and store the calculated coordinates X2, Y2, and Z2 in the memory. In response to the shoot button being pressed by the user, the image of the second reference mark may be stored in the memory 251. Like the process of calculating the coordinates X1, Y1, and Z1 of the first reference mark described above, the coordinates X2, Y2, and Z2 of the second reference mark may also be calculated through the controller 250 in consideration of the offset value.

Referring to FIG. 7, the controller 250 may calculate a distance between two positions of the first and second reference marks using the detected positions of the first and second reference marks described above and store the calculated distance in the memory 251.

Then, while the user moves the vision camera along a route of the shield dam to be formed on the PCB using the front, rear, left, and right moving buttons of the input unit 253, the user may confirm a real-time image imaged through the vision camera and input a plurality of coordinates located on the moving route of the nozzle. The corresponding coordinate may be input in response to a coordinate input button provided in the input unit 253 being pressed in a state that the vision camera is located in any point of the moving route of the nozzle. The input coordinate may be stored in the memory 251.

The plurality of coordinates may include a coordinate (e.g., the coordinate Ap of FIG. 8) at a point that the nozzle starts to discharge a material, a coordinate at a point that the nozzle stops to discharge the material (in response to the shield dam being in a closed-loop form, the stop point may be disposed almost close to the stop point Ap.), and coordinates for points (e.g., the coordinates for points Bp, Cp, Dp, Ep, and Fp of FIG. 8) that the nozzle changes the direction during movement (e.g., along distances A, B, C, D, E and F).

To program the moving route of the nozzle, the input unit 253 may include a moving button configured to move the nozzle to a designated coordinate, a line button configured to provide a command which allows the nozzle to discharge the material and simultaneously to move, and various command buttons such as a rotation button configured to switch the moving direction of the nozzle. The user may generate a moving route of the nozzle by matching the command buttons with the coordinate and a rotation speed.

In response to the moving route of the nozzle being programmed through the user as described above, the controller 250 may automatically form the shield dam in the PCB by moving the nozzle along the moving route and simultaneously discharging the material.

The nozzle route data input through the input unit 253 may be stored in the memory 251. The controller 250 may move the nozzle along the previously input route by driving the X-Y-Z-axis moving unit 231 and the rotation driver 219 according to the nozzle route data stored in the memory 251. The nozzle route data may include a distance that the nozzle 216 moves to a straight direction along the top surface of the PCB 110 and the rotation direction and angle of the nozzle 216.

It has been described in an embodiment of the present disclosure that the user directly inputs the moving route of the nozzle through the input unit 253, but this is not limited thereto and the nozzle moving route may be pre-stored in the memory 251. To correspond to patterns of the shield dams variously formed according to products, a plurality of nozzle moving routes corresponding to the patterns may be pre-stored. In addition to the nozzle moving route, calibration information, reference position information of the nozzle, reference position information of the PCB, reference height information of the PCB, and the like may be pre-stored in the memory 251 through the input unit 253.

Figure 8:
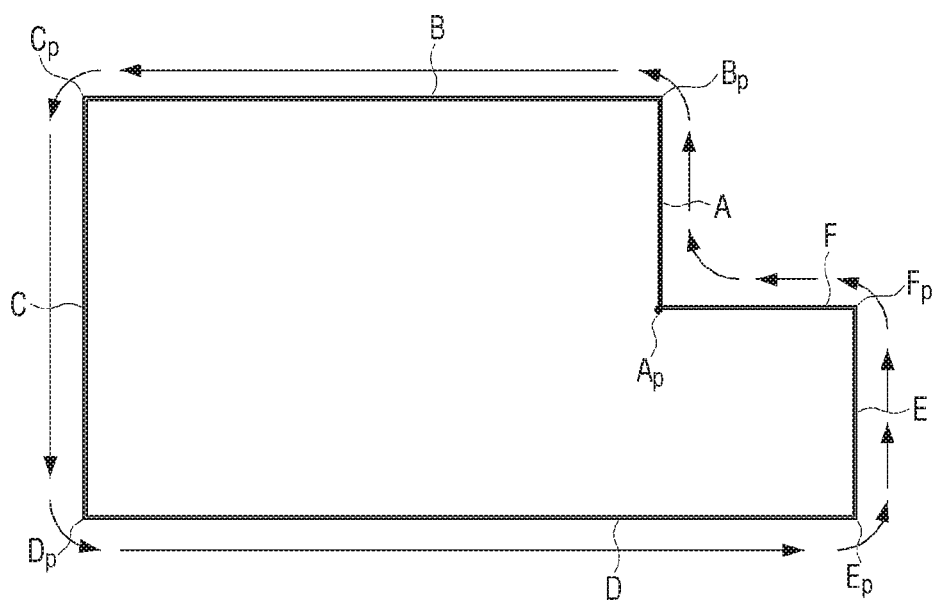
FIG. 8 is a diagram illustrating a moving route of a nozzle input through an input unit provided in a material discharge device according to an embodiment of the present disclosure.

FIG. 8 is a diagram illustrating a moving route of a nozzle input through an input unit provided in a material discharge device according to an embodiment of the present disclosure.

Referring to FIG. 8, the nozzle 216 may move along a route for forming the shield dam by the nozzle moving route data, and a detailed example will be described below with reference to FIG. 8.

The nozzle 216 may be set to a coordinate corresponding to the start point Ap and linearly move to +Y-axis direction by an A section through the X-Y-Z-axis moving unit 231. The nozzle 216 may rotate 90 degrees at an end point Bp of the A section to a counterclockwise direction through the rotation driver 219 and then linearly move to an −X-axis direction by a B section through the X-Y-Z-axis moving unit 231. The nozzle 216 may sequentially repeat the linear movement and rotation with respect to the remaining B, C, D, E, and F sections through the X-Y-Z-axis moving unit 231 and the rotation driver 219 and in response to the nozzle 216 being returned to the start point Ap, the route movement of the nozzle 216 may be completed.

Figure 9:
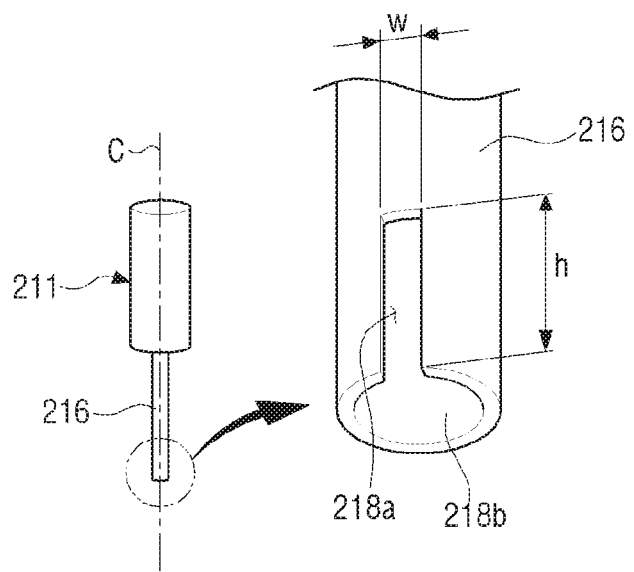
FIG. 9 is a diagram illustrating a discharge hole of a nozzle of a material discharge device through which a material for forming a shield dam is discharged according to an embodiment of the present disclosure.

FIG. 9 is a diagram illustrating a discharge hole of a nozzle of a material discharge device through which a material for forming a shield dam is discharged according to an embodiment of the present disclosure.

Referring to FIG. 9, a first discharge hole 218a may be formed in a lower lateral surface of the nozzle 216 and a second discharge hole 218b is formed in a bottom surface of the nozzle 216 so that the nozzle 216 moves and rotates through the X-Y-Z-axis moving unit 231 and the rotation driver 219 and simultaneously discharges the material. The first and second discharge holes 218a and 218b may communicate with each other and thus the material may be simultaneously discharged through the first and second discharge holes 218a and 218b.

The first discharge hole 218a may have a rectangular shape similar to a final cross-section of the shield dam 120 to form the shield dam having a large ratio of a height h to a width w (hereinafter, referred to as aspect ratio). In an embodiment of the present disclosure, an aspect ratio r of the first discharge hole 218a may be represented with a value that the height h of the first discharge hole 218a is divided by the width w of the first discharge hole 218a. For example, the aspect ratio r in an exemplary embodiment of the present disclosure may be represented with the following Equation 1.

$$\text{Aspect ratio } (r) = h/w \qquad \text{Equation 1}$$

As the aspect ratio of the first discharge hole 218a is increased, the shield dam 120 may have a high aspect ratio structure that a width is smaller and a height is large. The height h of the first discharge hole 218a may be set to correspond to the height (e.g., the height h2 of FIG. 1A) of the shield dam 120 and the height (e.g., the height h3 of FIG. 2) of the shield dam 120'.

The nozzle 216 may move along the preset route (e.g., C as shown in FIG. 9) and simultaneously discharge the material over the ground pad 114 through the first and second discharge holes 218a and 218b to form the shield dam 120.

Figure 10A:
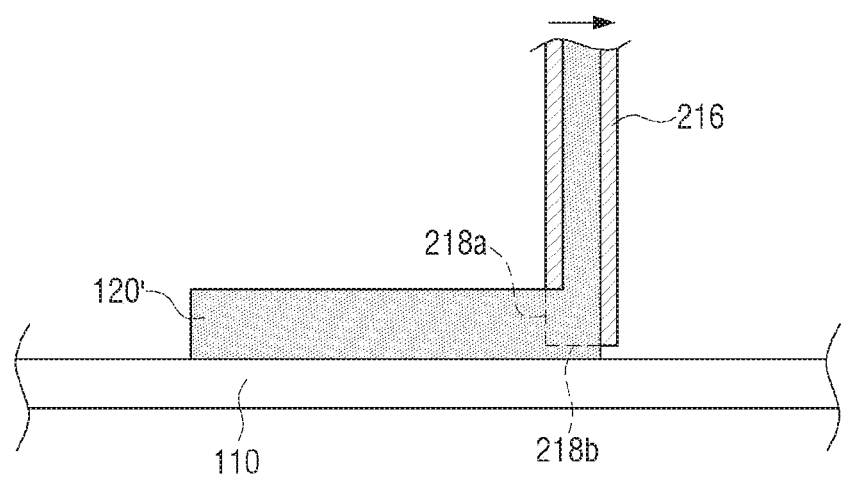
FIG. 10A is a diagram illustrating a state that a material for forming a shield dam is discharged through the nozzle illustrated in FIG. 9 according to an embodiment of the present disclosure.

FIG. 10A is a diagram illustrating a state that a material for forming a shield dam is discharged through the nozzle illustrated in FIG. 9 wherein a ground pad electrically coupled to a lower end of the shield dam is omitted according to an embodiment of the present disclosure.

Referring to FIG. 10A, the nozzle 216 may move along a route for forming a shield dam 120 and simultaneously discharge the material through the first and second discharge holes 218a and 218b. The shield dam 120 having a fixed aspect ratio r according to the shape of the first discharge hole 218a may be formed. The first discharge hole 218a may be disposed toward an opposite direction of the moving direction of the nozzle 216.

Figure 10B:
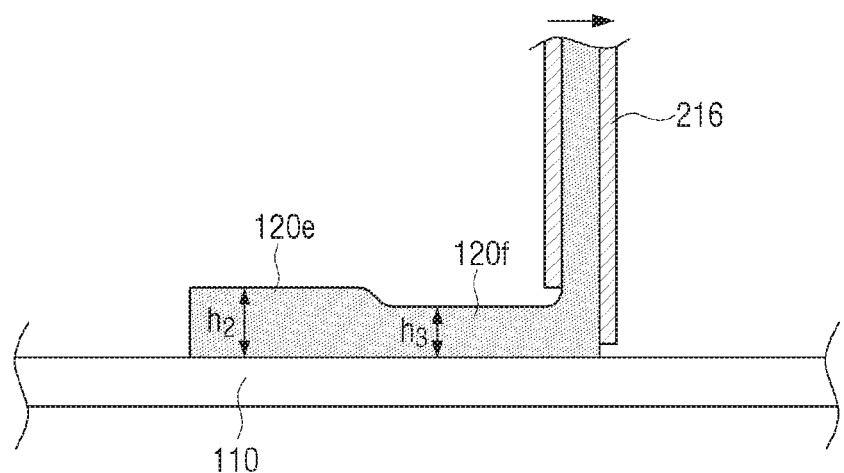
FIG. 10B is a diagram illustrating an example that a plurality of shield dams having different heights are formed through the nozzle illustrated in FIG. 9 according to an embodiment of the present disclosure.

FIG. 10B is a diagram illustrating an example that a plurality of shield dams having different heights are formed using a single nozzle wherein a ground pad electrically coupled to a lower end of the shield dam is omitted according to an embodiment of the present disclosure.

Referring to FIG. 10B, the nozzle 216 may move at a first speed and simultaneously discharge the material with a first discharge amount to form a first shield dam 120e having a height h2. Subsequently, the nozzle 216 may discharge the material with the first discharge amount and simultaneously move at a second speed larger than the first speed to form a second shield dam 120f having a height h3 smaller than the height h2. In another example, the nozzle 216 may discharge the material with a second discharge amount smaller than the first discharge amount and simultaneously move at the first speed to form the second shield dam 120f having the height h3 smaller than the height h2.

The shield dam having a desired height may be formed using the single nozzle 216 by appropriately controlling the discharge amount of the material discharged from the nozzle 216 and the moving speed of the nozzle 216.

Figure 11:
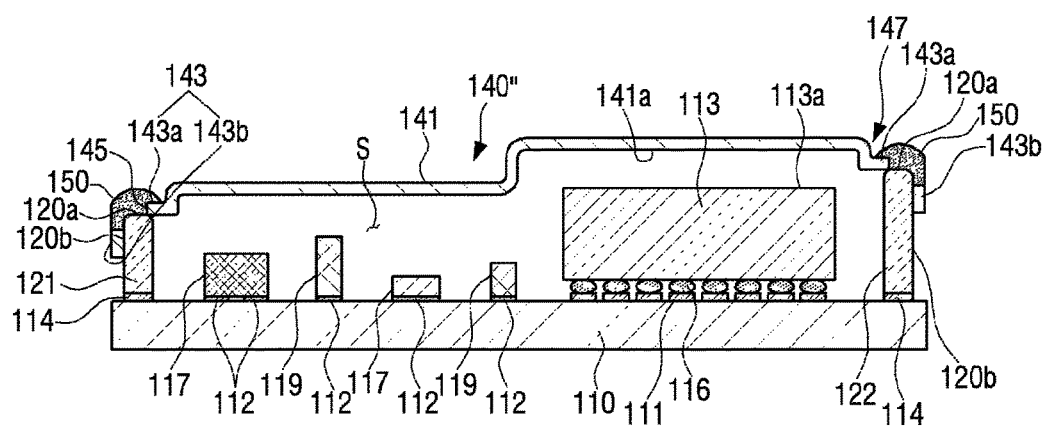
FIG. 11 is a cross-sectional diagram illustrating an example that a shield dam having different heights is formed in both sides of a PCB according to an embodiment of the present disclosure.

FIG. 11 is a cross-sectional diagram illustrating an example that a shield dam having different heights is formed in both sides of a PCB according to an embodiment of the present disclosure. FIG. 11 illustrates an example that the shielding structure is almost similar to the shielding structure of FIG. 1A and heights in a left portion and a right portion of the shield dam formed on a single route are different from each other.

Referring to FIG. 11, the height of the right portion 122 of the shield dam may be formed larger than that of the left portion 121 of the shield dam. The left portion 121 and the right portion 122 of the shield dam may be formed on the same route and may be implemented by appropriately controlling the discharge amount of the material and the moving speed of the nozzle while the nozzle moves along the route and discharges the material as described with reference to FIG. 10B.

A shield cover 140" may be suitably modified to correspond to a height difference between the left portion 121 and the right portion 122 of the shield dam. For example, as illustrated in FIG. 11, a step may be formed in both sides of the shield cover 140" so that the right portion of the shield cover 140" may be formed higher than the left portion thereof.

The material discharge device 200 may supply the material for forming the shield dam to the nozzle 216 from the storage chamber 211. The material stored in the storage chamber 211 may be moved to the inside of the nozzle 216 through a moving screw (not shown) provided in an inside of the storage chamber 211. The controller 250 may control the discharge amount of the material discharged from the nozzle 216 through control of a rotation speed of the moving screw. The material discharged from the nozzle 216 may be continuously discharged in a section that the nozzle linearly moves as well as in a point that the nozzle is rotated to form the shield dam. It has been described in an embodiment of the present disclosure that the nozzle moving route for forming the shield dam is a closed loop, but this is not limited thereto and the nozzle moving route may be an opened loop. The nozzle 216 may linearly move or move along a curve having a fixed curvature.

Referring back to FIG. 7, the discharge hole of the nozzle 216 may often be cleaned or newly replaced in the material discharge device 200 or an end portion of the nozzle which discharges the material may not often be accurately matched with a preset setup position in the material discharge device 200. Accordingly, the material discharge device 200 may include a nozzle position measurement sensor 232 which allows the nozzle 216 to be set to the setup position.

The nozzle position measurement sensor 232 may include a vision camera and may be disposed below the nozzle 216 at a fixed interval. The calibration of the nozzle may be performed to match the end portion of the nozzle with the origin of the nozzle by reading an end position of the nozzle through an image imaged through the nozzle position measurement sensor 232, comparing the read end position with the nozzle origin value pre-stored in the memory 251, and moving the nozzle 216 by X and Y values according to a comparison difference. The movement of the nozzle 216 may be performed through the movement of the nozzle mounting unit according to the X-Y-Z-axis moving unit 231.

Referring to FIG. 7, the material discharge device 200 may set the start point Ap of the nozzle 216 for material discharge by detecting a posture of the PCB in an X-Y plane in which the PCB is placed in response to the PCB being loaded into a position for forming the shield dam. To detect the posture after the loading of the PCB, the material discharge device 200 may include the PCB reference position measurement sensor 233 and a PCB height measurement sensor 234.

The PCB reference position measurement sensor 233 may be a sensor configured to determine a PCB loading regular position and may include a vision camera. The PCB reference position measurement sensor 233 may detect whether or not the PCB which is loaded into the working space to form the shielding structure is located in a preset position or may detect a distorted difference from the preset position.

For example, in response to the PCB being loaded into the working position, the controller 250 may move the PCB reference position measurement sensor 233 to the preset coordinate of the first reference mark, image the current first reference mark of the PCB, and determine whether or not the PCB reference position measurement sensor 233 is located in the regular position by comparing the currently imaged first reference mark and a preset shape of the first reference mark.

In response to the PCB reference position measurement sensor 233 being determined to be located in the regular position, the controller 250 may calculate a position difference between the current coordinate of the first reference mark and a preset coordinate of the first reference mark. Subsequently, the controller 250 may calculate a position difference between a current coordinate of the second reference mark and a preset coordinate of the second reference mark through the same method as the method of calculating the position difference in the coordinate of the first reference mark.

The controller 250 may measure a distortion degree that the PCB currently loaded is distorted to the left or right on the X-Y plane on the basis of the Z-axis through the calculated position differences in the coordinates of the first and second reference marks.

The distortion degree of the currently loaded PCB may be set to the offset value and the controller 250 may apply the offset value to the currently loaded PCB by applying the offset value to the moving route of the nozzle preset through the input unit 253.

The PCB height measurement sensor 234 may be configured to measure a tilt angle of the PCB tiled on the X-Y plane with respect to the Z-axis, for example, a degree distorted by a preset height and may include a laser sensor. The PCB height measurement sensor 234 may measure heights for arbitrary three points on the PCB to measure the height of the PCB. The controller 250 may calculate the height of the top surface of the PCB through the measured height values of the three points and calculate a value (for example, several hundreds of µm) of the end portion of the nozzle spaced from the PCB on the basis of the calculated heights. Accordingly, in response to the nozzle 216 being moved on the PCB to form the shield dam, the end portion of the nozzle may be maintained to a fixed height from a surface of the PCB and thus the nozzle may be smoothly moved without interference with the top surface of the PCB. The material discharge device 200 may measure the height for the top surface of the PCB in real time through the PCB height measurement sensor 234 during the movement of the nozzle 216. The controller 250 may compare the height value measured in real time with the height value pre-stored in the memory 251. For example, the nozzle 216 may be interfered with the top surface of the PCB in response to the measured height value being smaller than the pre-stored height value. In this example, the controller 250 may stop the movement of the nozzle 216 and inform the worker of error occurrence by driving a predetermined alarm device (for example, a speaker or a beacon light).

Referring to FIG. 7, the material discharge device 200 may include a PCB loading and unloading unit 235 configured to load the PCB into the working position to form the shield dam and unload the PCB after the formation of the shield dam is completed.

The material discharge device 200 may include a heater 236 for PCB heat configured to increase a temperature of the PCB to a fixed value to shorten a dry time of the formed shield dam 120.

The material for forming the shield dam 120 may be formed of an electroconductive material having electrical conductivity of 1.0E+04 S/m or more. The electroconductive material may contain an electroconductive filter and a binder resin.

The electroconductive filler may include a metal such as Ag, Cu, Ni, Al, or Sn or may include a conductive carbon such as carbon nanotube (CNT) or graphite. The electroconductive filler may include a metal-coated material such as Ag/Cu, Ag/glass fiber, or Ni/graphite or may include a conductive polymer material such as polypyrrole or polyaniline. The electroconductive filler may be configured in any one of a flake type, a spherical type, a rod type, and a dendrite type.

The binder resin may include a silicon resin, an epoxy resin, a urethane resin, or alkyd resin. The material for the shield dam 120 may further contain additives for improving other performance (for example, a viscosity agent, an antioxidant, a high-molecular surfactant, and the like) and a solvent (for example, water, alcohol, and the like).

The material for the shield dam 120 may have high viscosity (about 200,000 cP) so as to form the shield dam 120 having a high aspect ratio r and to maintain the shape of the discharged material without flow of the discharged material in the forming of the shield dam or material discharge device 200. In response to the shield dam being formed using the material having the high viscosity, the aspect ratio and height of the shield dam may be increased.

Using the material having the high viscosity, even in response to a both-sided PCB being turned over to form a shield dam in a rear side immediately after a shield dam is formed in a front side, the material shape of the shield dam formed in the front side may be maintained without the material flow. Accordingly, the entire working process may be swiftly performed.

Figure 12:
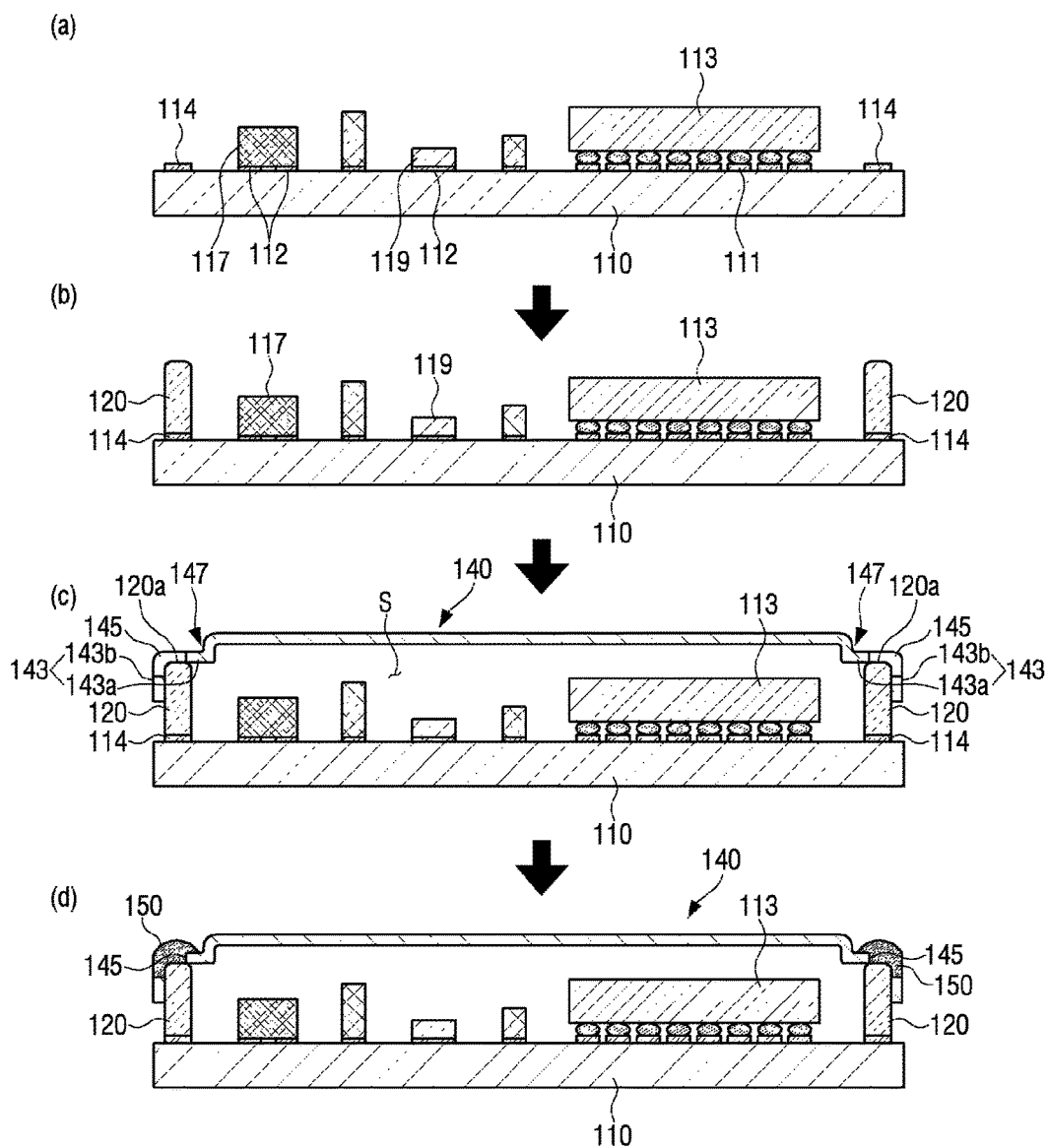
FIG. 12 is a cross-sectional diagram sequentially illustrating a manufacturing process of a hollow shielding structure for different types of circuit elements according to an embodiment of the present disclosure.
Figure 13:
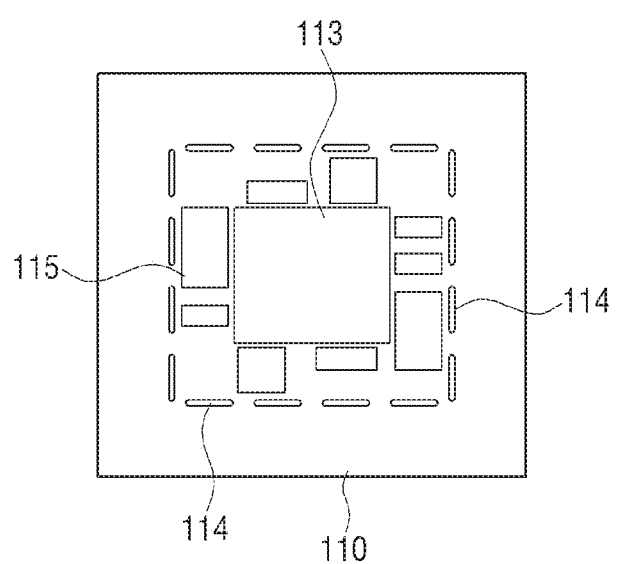
FIG. 13 is a diagram illustrating an example of a ground unit being patterned in a PCB in a discontinuous hidden line form according to an embodiment of the present disclosure.
Figure 14:
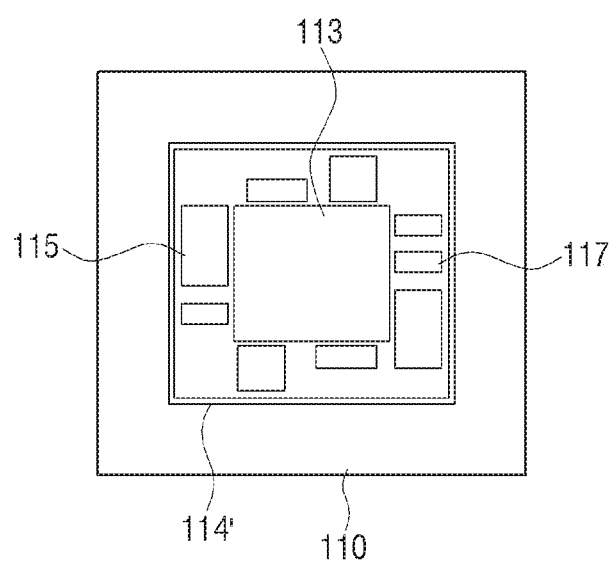
FIG. 14 is a diagram illustrating an example that a ground unit is patterned in a PCB in a continuous solid line form according to an embodiment of the present disclosure.

FIG. 12 is a cross-sectional diagram sequentially illustrating a manufacturing process of a hollow shielding structure for different types of circuit elements of FIG. 1A according to an embodiment of the present disclosure, and FIGS. 13 and 14 are diagrams illustrating ground units or pads according to various embodiments of the present disclosure.

Referring to item (a) in FIG. 12, the connection pads 111 and 112 and the ground pad 114 may be patterned in the top surface of the PCB 110 and the element 113 and the passive elements 117 and 119 as the circuit element may be adhered to be electrically coupled to the connection pads 111 and 112.

The ground pad 114 may be patterned in the PCB 110 in a discontinuous hidden line form as illustrated in FIG. 13. The ground pad 114 may be formed to surround the elements 113, 117, and 119 and an inner side of the ground pad 114 may be a shield region. The ground pad 114 may be integrally formed with the ground layer 115 formed in the inner side of the PCE 110.

Referring to FIG. 14, a ground pad 114' may be patterned in the PCB 110 in a continuous solid line form. In response to the ground pad 114' being in the solid line form, the contact area of the ground pad with the shield dam 120 may be increased and the electrical stability of the ground pad being higher than the ground pad having the discontinuous hidden line form may be ensured. The ground pad 114' may be integrally formed with the ground layer 115 formed in the inner side of the PCB 110.

Referring to item (b) in FIG. 12, the shield dam 120 may be formed in the top surface of the PCB 110 to be in contact with the ground pad 114. The shield dam 120 may be formed substantially in a closed loop form to surround the element 113 and the plurality of circuit elements 117 and 119 along the ground pad 114. The shield dam 120 may be formed of a flowable material having high viscosity so that the shield dam is formed higher than heights of the element 113 and the plurality of circuit elements 117 and 119.

Referring to item (c) in FIG. 12, the shield cover 140 may be placed in the upper portion 120a of the shield dam 120. The shield cover 140 may have the step 147 formed between the upper plate 141 and the seating portion 143 to form a fixed air gap between the shield cover 140 and the element 113. The shield cover 140 may be spaced from the remaining plurality of circuit elements 117 and 119 to form a fixed air gap. In an embodiment of the present disclosure, the elements 113, 117, and 119, for example, the element 113 may be insulated from the shield dam 120 and the shield cover 140 through the air. Accordingly, unlike the related art, the process for filling the inside of the cured shield dam 120 with a separate insulating material may not be necessary and change in frequency characteristic due to the insulating material may be basically removed. The structure for RF signal matching according to the change in the frequency characteristic in products may not be necessary and thus fabrication cost may be reduced and the fabrication process may be shortened.

Referring to item (d) in FIG. 12, the adhesion unit 150 may be formed by applying a material having conductivity and an electromagnetic wave shield characteristic along the seating portion 143 of the shield cover 140 placed in the shield dam 120. The material for the adhesion unit 150 may have fixed flowability and a portion of the material for the adhesion unit 150 may flow in the plurality of slots 145 formed in the seating portion 143 so that the material for the adhesion unit 150 may not be spread to an undesired range but may be located in a desired region in the process of applying the material in a top surface of the seating portion.

A portion of the adhesion unit 150 may flow in the plurality of slots 145 to be in contact with the shield dam 120 and the remaining portion thereof may be left in the top surface of the seating portion 143.

The adhesion unit 150 may electrically couple the shield cover 140 to the shield dam 120 to expand the ground region from the shield dam 120 to the shield cover 140 and thus the stable ground path may be provided. The cured adhesion unit 150 may structurally firmly fix the shield cover 140 to the shield dam 120.

Hereinafter, a process of manufacturing a hollow shielding structure for different types of circuit elements and a process of reworking the formed shielding structure from a PCB will be described in detail.

Figure 15:
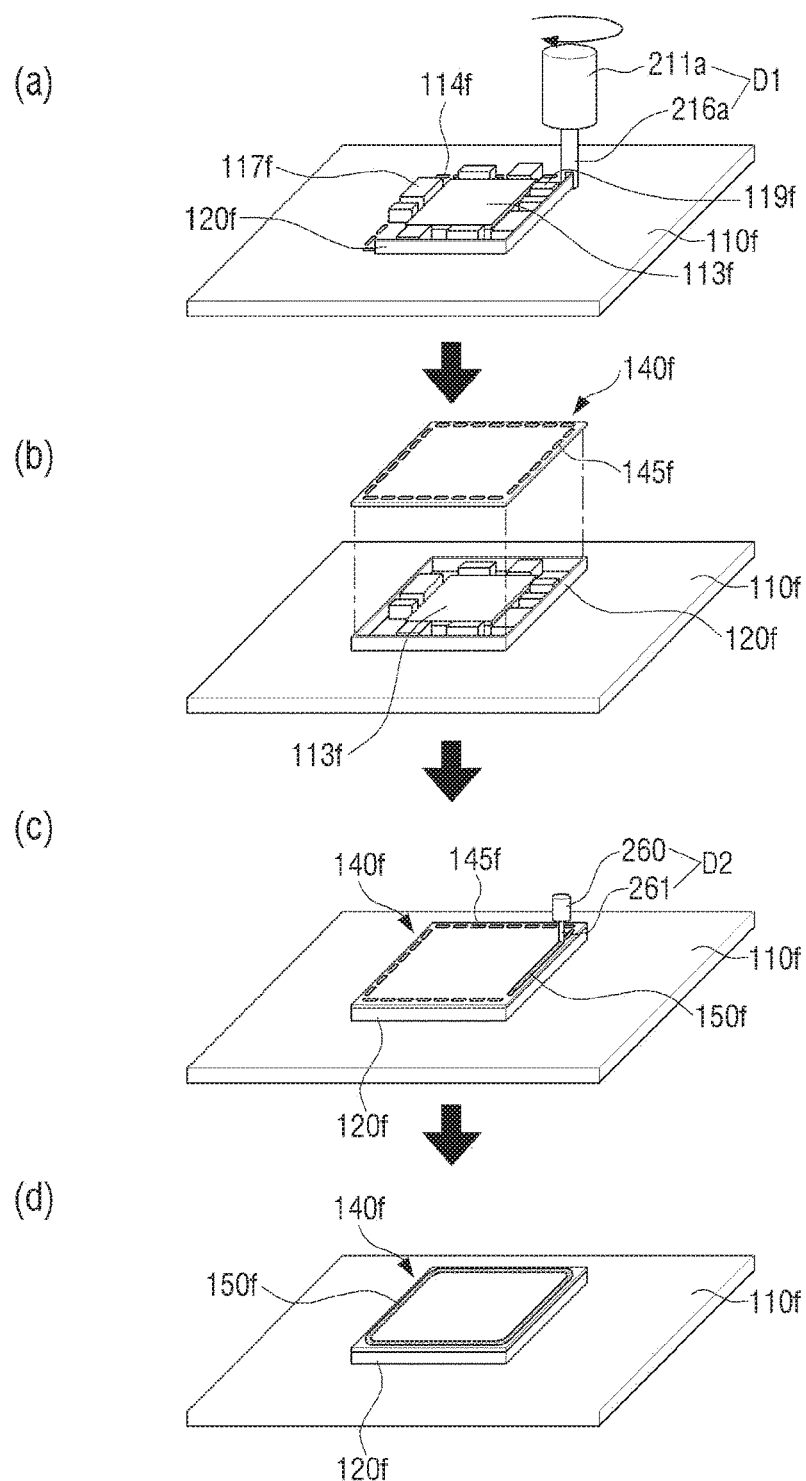
FIG. 15 is a perspective view sequentially illustrating a manufacturing process of a hollow shielding structure for different types of circuit elements according to an embodiment of the present disclosure.
Figure 16A:
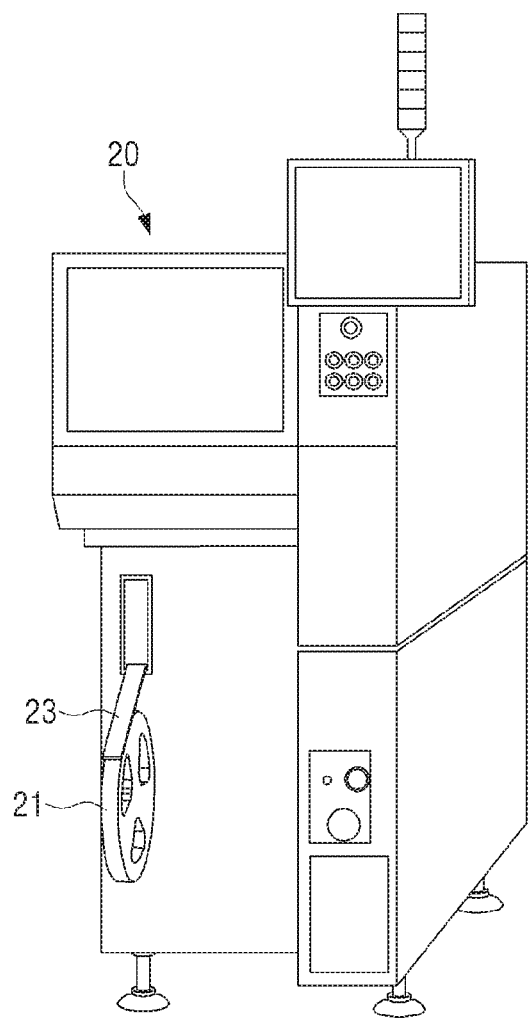
FIG. 16A is a perspective view illustrating mounting equipment for mounting a shield cover on a PCB according to an embodiment of the present disclosure.
Figure 16B:
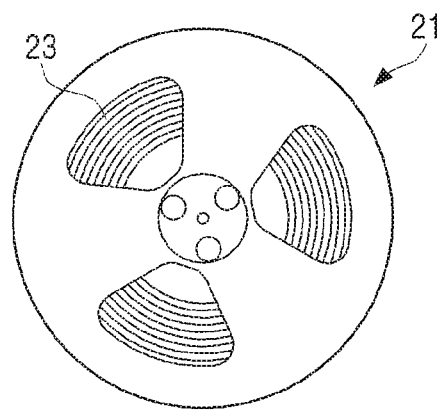
FIG. 16B is a diagram illustrating a reel cartridge provided in the mounting equipment of FIG. 16A according to an embodiment of the present disclosure.
Figure 16C:
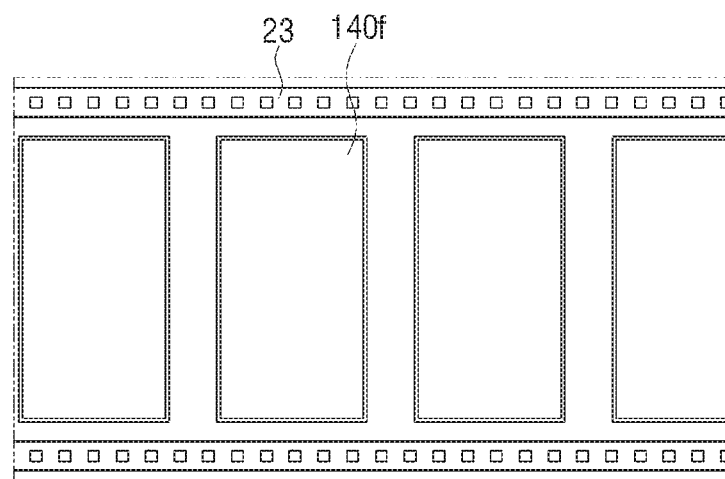
FIG. 16C is a diagram illustrating a plurality of shield covers attached to a film unit of the reel cartridge of FIG. 16B at intervals according to an embodiment of the present disclosure.
Figure 17:
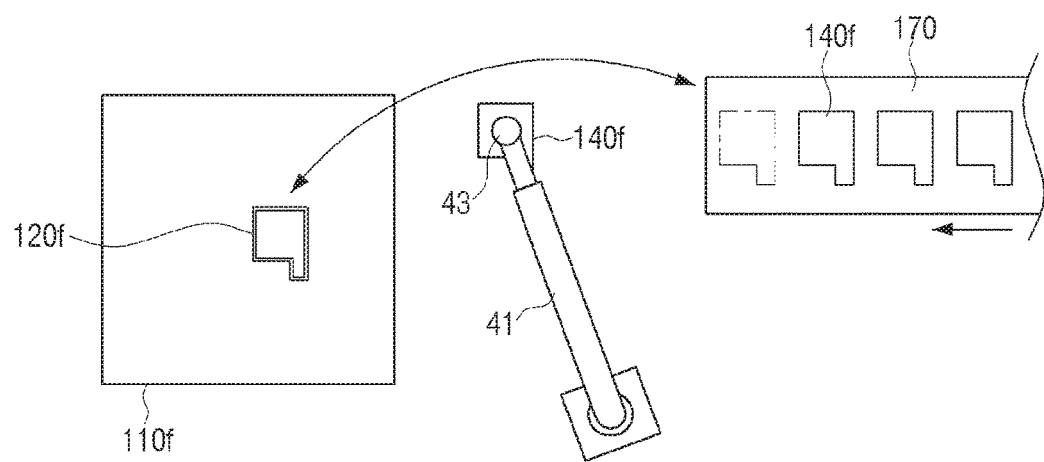
FIG. 17 is a diagram illustrating an example that a shield cover is placed in a shield dam through a robot arm provided inside mounting equipment according to an embodiment of the present disclosure.
Figure 18:
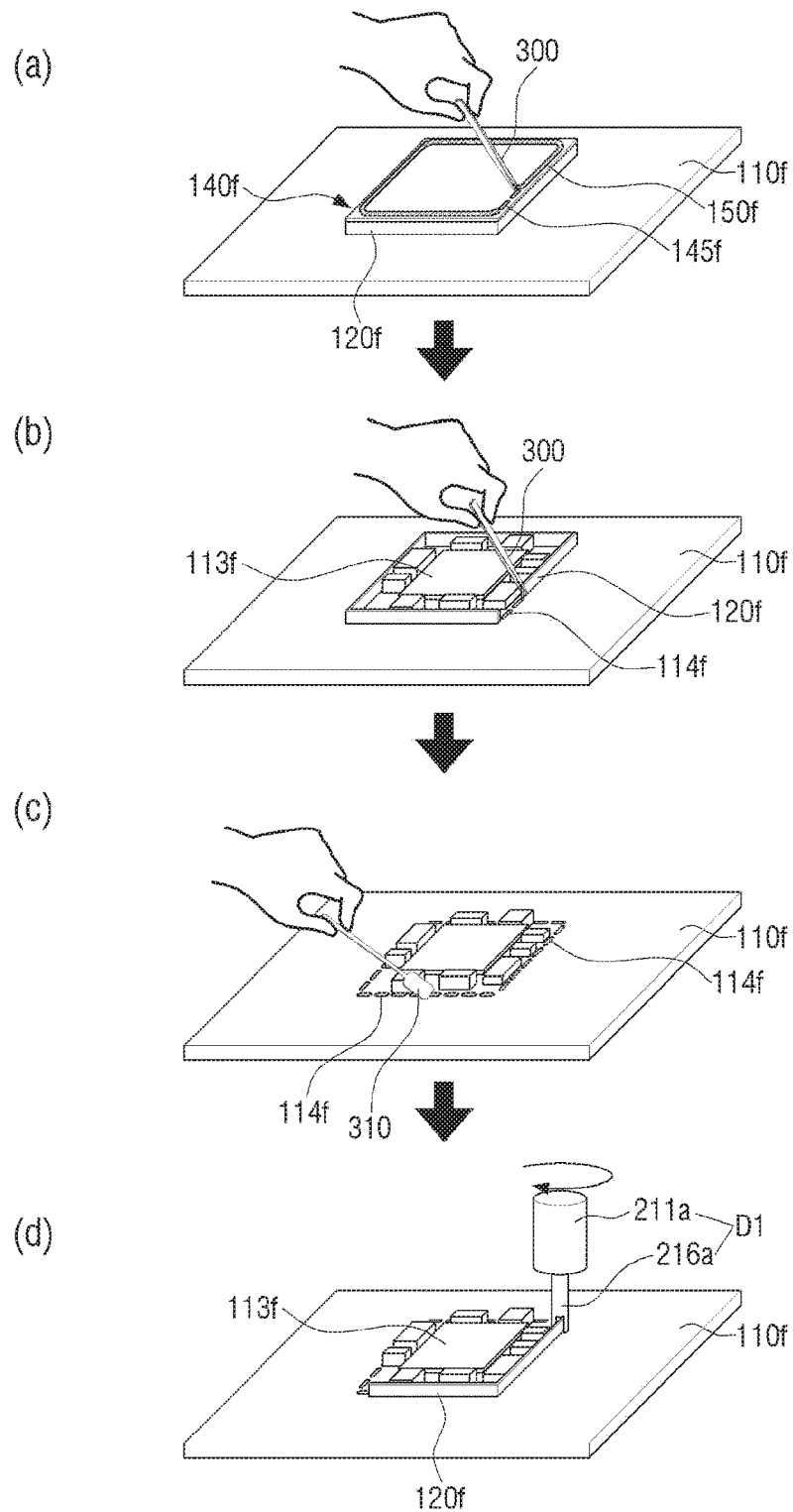
FIG. 18 is a perspective view illustrating a process of reworking the hollow shielding structure for different types of circuit elements formed through the manufacturing method of FIG. 15 from a PCB and forming a shield dam again according to an embodiment of the present disclosure.

FIG. 15 is a perspective view sequentially illustrating a manufacturing process of a hollow shielding structure for different types of circuit elements according to an embodiment of the present disclosure. FIG. 16A is a perspective view illustrating mounting equipment for mounting a shield cover on a PCB according to an embodiment of the present disclosure, FIG. 16B is a diagram illustrating a reel cartridge provided in the mounting equipment of FIG. 16A according to an embodiment of the present disclosure, and FIG. 16C is a diagram illustrating a plurality of shield covers attached to a film unit of the reel cartridge of FIG. 16B according to an embodiment of the present disclosure. FIG. 17 is a diagram illustrating an example that a shield cover is placed in a shield dam through a robot arm provided inside mounting equipment according to an embodiment of the present disclosure. FIG. 18 is a perspective view illustrating a process of reworking the hollow shielding structure formed through the manufacturing method of FIG. 15 from a PCB and forming a shield dam again according to an embodiment of the present disclosure.

A nozzle moving route may be input through a route input unit 253 of the material discharge device as a pretreatment process. If necessary, the material discharge device may set the nozzle to the origin and may locate the nozzle in a start point for material discharge by detecting the posture of the PCB loaded into a working position.

Referring to item (a) in FIG. 15, a shield dam 120f may be formed in a top surface of a PCB 110f along a ground pad 114f to surround an element 113f and a plurality of circuit elements 117f and 119f mounted on the PCB 110f using a dispenser 212 including a storage chamber 211a and a nozzle 216a. The shield dam 120f may be formed in a height having a fixed aspect ratio.

Referring to item (b) in FIG. 15, a shield cover 140f may be placed in an upper portion of the cured shield dam 120f. The shield cover 140f may have a simple flat plate form without formation of a step unlike the shield covers 140 and 140' as illustrated in FIGS. 4 and 6.

A plurality of slots 145f may be formed at intervals along a border portion of the shield cover 140f. The plurality of slots 145f may be arranged to form a closed loop corresponding to a shape of the shield dam 120f.

In response to the shield cover 140f being placed in the shield dam 120f, the plurality of slots 145f may be arranged in a position that the upper portion of the shield dam 120f is exposed.

After the PCB 110f in which the shield dam 120f is formed is transferred from the material discharge device to shield cover mounting equipment 20 illustrated in FIG. 16A, the process of placing the shield cover 140f in the shield dam 120f may be performed.

A reel cartridge 21 may be mounted on one outer one side of the shield cover mounting equipment 20. A film unit 23 may be rolled in the reel cartridge 21 in a state that a plurality of shield covers 140f are attached on one surface of the film unit 23 at intervals. A transparent film configured to cover the plurality of shield covers 140f may be provided in the film unit 23 so that the shield covers 140f are stably attached to the film unit 23.

The reel cartridge 21 may supply the shield film to the mounting equipment 20. The shield film may be detached from the film unit 23 through a predetermined separator in response to the shield cover being supplied to the inside of the mounting equipment 20 together with the film unit 23.

Referring to FIG. 17, the shield cover 140f separated from the film unit 23 may be transferred through a conveyor belt 170. A robot arm 41 provided in the inside of the mounting equipment 20 may vacuum-adsorb the shield cover 140f carried on the conveyor belt 170 through an adsorption pad 43, move the shield cover 140f to an upper side of the shield dam 120f, and place the shield cover 140f in an upper portion of the shield dam 120f. The conveyor belt may be replaced with a transfer unit of the related art for transferring the shield cover 140f.

Referring to item (c) in FIG. 15, the mounting equipment 20 may include a separate dispenser D2 therein which includes a storage chamber 260 configured to store a flowable material for the adhesion unit 150f and a nozzle 261 configured to discharge the flowable material to a top surface of the shield cover, for example, toward the slots 145f to form the adhesion unit 150f.

The adhesion unit 150f may be formed on the top surface of the shield cover 140f along the plurality of slots 145f formed in the shield cover 140f using the prepared dispenser D2. Since the adhesion unit 150f is flowable, a portion of the material may flow in the slots 145f to be filled in the slots during the applying of the material and a remaining portion of the material may be formed on the top surface of the shield cover 140f.

Referring to item (d) in FIG. 15, the adhesion unit 150f discharged along the plurality of slots 145f may be cured to have fixed hardness through a curing treatment. The formed adhesion unit 150f may electrically couple the shield dam 120f and the shield cover 140f to expand the ground region from the shield dam 120f to the shield cover 140f.

The adhesion unit 150f may be discharged to the top surface of the shield cover 140f in the process of forming the shielding structure, but this is not limited thereto. For example, before the shield cover 140f is placed in the shield dam 120f, the adhesion unit 150f may be discharged along an upper portion of the shield dam 120f and then the shield cover 140f may be placed in the adhesion unit 150f while pressing with fixed pressure before the shield cover 140f is cured. The adhesion unit 150f may be curing-treated in a state that the shield cover 140f is placed in the adhesion unit 150f. In this example, it is not necessary to separately form the plurality of slots 145f in the shield cover 140f.

The process of reworking the shielding structure may be performed in inverse order of the process of forming the shielding structure.

Referring to item (a) in FIG. 18, the adhesion unit 150f may be detached from the shield cover 140f using a predetermined tool, for example, a pincette 300. For example, the adhesion unit 150f presented in the plurality of slots 145f may be detached.

Referring to item (b) in FIG. 18, after the adhesion unit 150f is detached from the shield cover 140f, the shield cover 140f may be separated from the shield dam 120f. Subsequently, the shield dam 120f may be detached from the PCB 110f using the same method as the method of detaching the adhesion unit 150f using the pincette 300.

Referring to item (c) in FIG. 18, a residue constituting a portion of the shield dam 120f may be left attached to the top surface of the PCB 110f which the shield dam 120f is not completely detached therefrom. The residue may be scraped from the top surface of the PCB 110f using a predetermined tool, for example, a paddle 310 to be easily removed from the PCB 110f.

Referring to item (d) in FIG. 18, the shield dam 120f may be formed again along the ground pad 114f using the dispenser D1 in a state that the shielding structure is reworked. Subsequently, the processes of FIGS. 15B to 15D may be sequentially performed to form a new shielding structure.

In response to the shield dam 120f and the adhesion unit 150f being formed using 3D printing, the previously formed shielding structure may be easily reworked and the element 113f and the plurality of circuit elements 117f and 119f may be reused.

Figure 19:
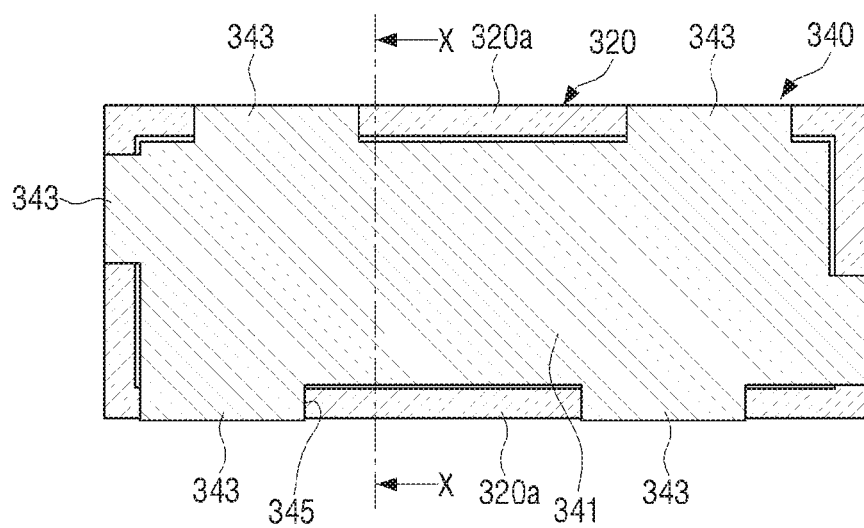
FIG. 19 is a plan view illustrating an example that a tape type shield cover is attached to a shield dam according to an embodiment of the present disclosure.
Figure 20:
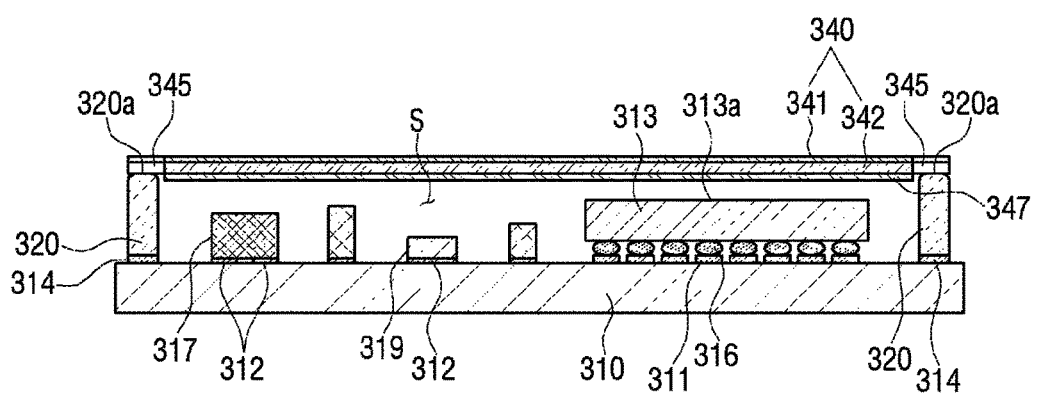
FIG. 20 is a cross-sectional diagram illustrating the tape type shield cover attached to the shield dam taken along line X-X of FIG. 19 according to an embodiment of the present disclosure.
Figure 21:
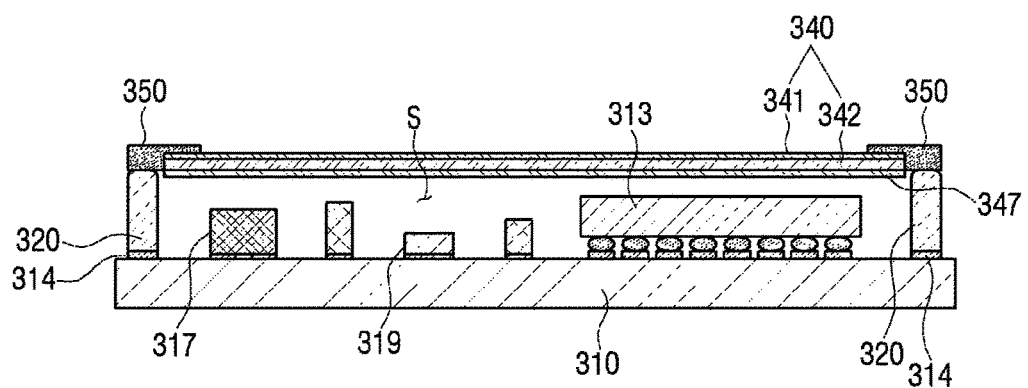
FIG. 21 is a cross-sectional diagram illustrating an example that an adhesion unit is applied in a state that a tape type shield cover is placed in a shield dam according to an embodiment of the present disclosure.

FIG. 19 is a plan view illustrating an example that a tape type shield cover is attached to a shield dam according to an embodiment of the present disclosure. FIG. 20 is a cross-sectional diagram illustrating the tape type shield cover attached to the shield dam taken along line X-X of FIG. 19. FIG. 21 is a cross-sectional diagram illustrating an example that an adhesion unit is applied in a state that a tape type shield cover is placed in a shield dam according to an embodiment of the present disclosure.

Referring to FIGS. 19 and 20, the shield cover 340 may be provided not in a metal plate form but in a conductive tape form. For example, a plurality of seating portions 343 which are placed in an upper portion 320a of a shield dam 320 may be formed along a border of the shield cover 340. In this example, a space 345 may be provided between adjacent seating portions 343, and thus an adhesion unit (e.g., the adhesion unit 350 of FIG. 21) may be applied even in the upper portion 320a of the shield dam 320 in response to the adhesion unit 350 is applied along a top surface of the seating portion 343.

Referring to FIG. 20, the shield cover 340 may include a shield layer 341 and an adhesion layer 342 formed in a bottom surface of the shield layer 341.

In response to the shield cover 340 being formed in the shield tape form, it is difficult to maintain a fixed form of the shield cover, for example, a flat plate form since the rigidity of the tape type shield cover is very lower than that of the shield cover formed in a metal plate form.

Accordingly, the shield cover 340 may include a shape maintenance layer 347 having a thin thickness and formed in a paper or film form to maintain the form of the shield cover 340. The shape maintenance layer 347 may be attached to one surface of the adhesion layer 342 in a peelable form.

Before the adhesion unit 350 is formed, the shield cover 340 may be temporarily attached to an upper portion of the shield dam 320 through the adhesion layer 342 as illustrated in FIG. 20. In response to the adhesion unit 350 being applied on the top surface of the shield cover 340 along a formation route of the shield dam 320 in the temporarily attached state, the shield cover 340 may be electrically coupled to the shield dam 320 and may be structurally rigidly fixed to the shield dam 320 as illustrated in FIG. 21. For example, the shield dam 320 may be formed on a ground pad 314 to have a fixed aspect ratio.

Referring to FIG. 21, an element 313 and a plurality of circuit element 317 and 319 may be shielded in a state to have a fixed gap with the shield dam 320 and the shield cover 340 through an insulating space S using the air as an insulator. The element 313 includes a top surface 313a, and connection pads 311, 312 and connection terminals 316 may be provided. The circuit element package according to the various embodiments of the present disclosure may be applied to various types of small home appliances as illustrated in FIGS. 22, 23A, 23B, 24, 25, and 26.

Figure 22:
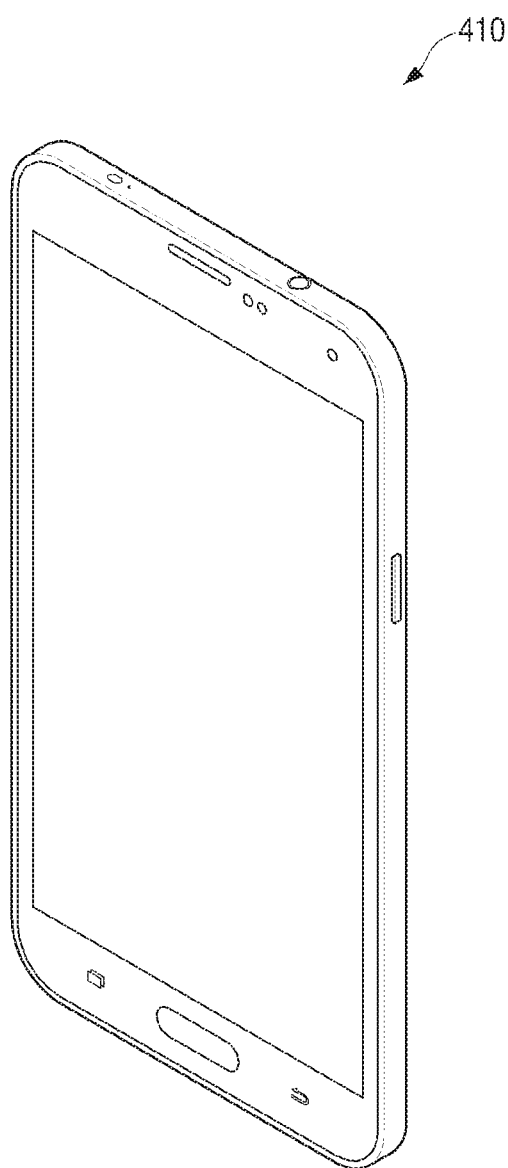
FIG. 22 is a perspective view illustrating a portable phone to which a hollow shielding structure for different types of circuit elements is applied according to an embodiment of the present disclosure.
Figure 23A:
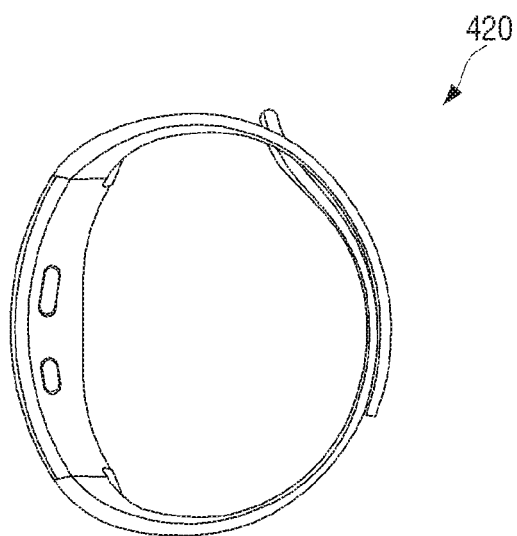
FIG. 23A is a perspective view illustrating a band type terminal to which a hollow shielding structure for different types of circuit elements is applied according to an embodiment of the present disclosure.
Figure 23B:
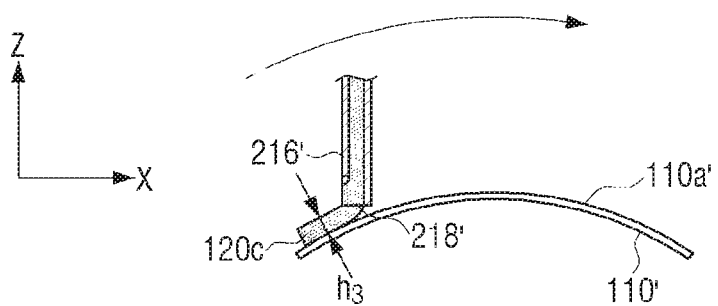
FIG. 23B is a diagram illustrating an example that a shield dam is formed on a PCB disposed inside a band type terminal according to an embodiment of the present disclosure.

For example, the circuit element package according to an embodiment of the present disclosure may be implemented on a PCB of a portable phone 410 illustrated in FIG. 22 and a PCB provided in a band type terminal 420 illustrated in FIG. 23A. The band type terminal 420 may include a PCB 110' formed to have a fixed curvature as illustrated in FIG. 23B. To implement a shield dam 120c on the PCB 110', a nozzle 216' may move with maintaining a uniform gap from a top surface 110a' of the PCB 110' in consideration of the curvature of the PCB 110'. Accordingly, while the controller 250 may measure a height of the top surface 110a' of the PCB 110' in real time through the PCB height measurement sensor 234, the controller 250 may adjust the height of the nozzle 216' and simultaneously move the nozzle 216'. The material discharged from a discharge hole 218' of the nozzle 216' may be formed to a desired height along the curvature of the PCB 110'.

Figure 24:
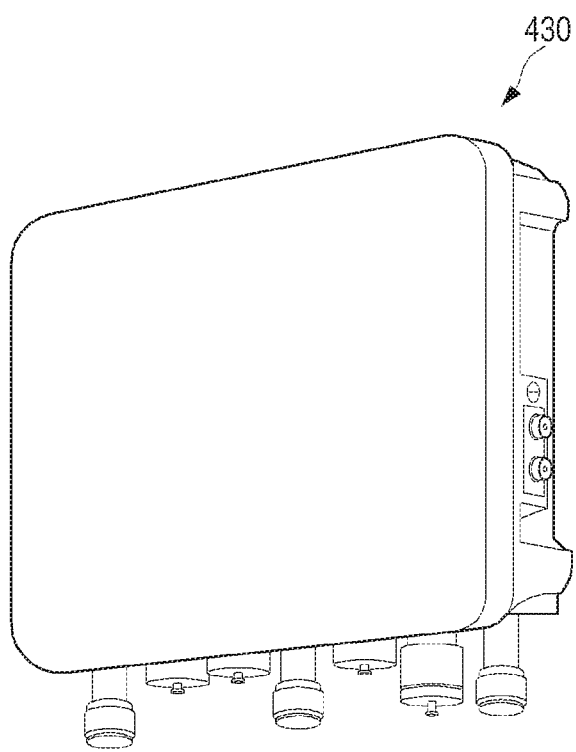
FIG. 24 is a perspective view illustrating an access point (AP) to which a hollow shielding structure for different types of circuit elements is applied according to an embodiment of the present disclosure.
Figure 25:
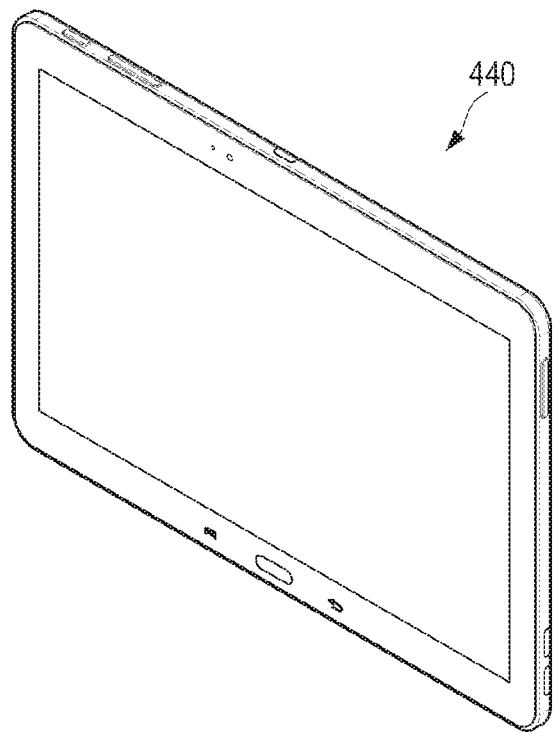
FIG. 25 is a perspective view illustrating a tablet personal computer (PC) to which a hollow shielding structure for different types of circuit elements is applied according to an embodiment of the present disclosure.
Figure 26:
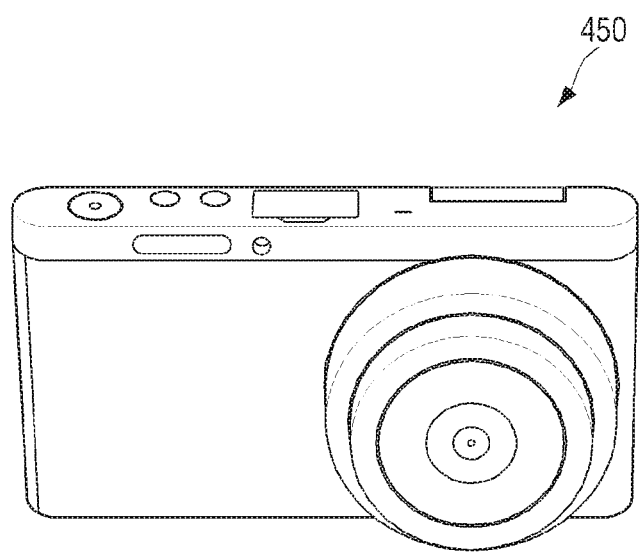
FIG. 26 is a perspective view illustrating a portable digital camera to which a hollow shielding structure for different types of circuit elements is applied according to an embodiment of the present disclosure.

The circuit element package according to the various embodiments of the present disclosure may be implemented on PCBs provided in communication equipment such as an access point (AP) 430 illustrated in FIG. 24, a tablet PC 440 illustrated in FIG. 25, and a portable digital camera 450 illustrated in FIG. 26.

Figure 27:
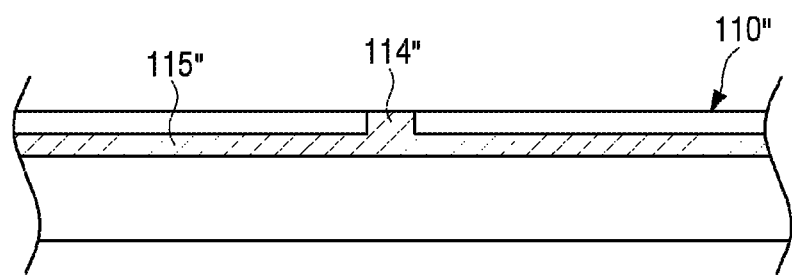
FIG. 27 is a schematic diagram illustrating another example of a ground pad formed in a PCB according to an embodiment of the present disclosure.

FIG. 27 is a schematic diagram illustrating another example of a ground pad formed in a PCB according to an embodiment of the present disclosure.

For clarity, it has been described in the various embodiments of the present disclosure that the ground pads protrude from surfaces of the PCBs, but this is not limited thereto. A ground pad 114" may be formed not to protrude from a surface of a PCB 110" and for example, a top surface of the ground pad 114" may be formed substantially to coincide with the surface of the PCB 110" as illustrated in FIG. 27. For example, the ground pad 114" may be integrally formed with the ground layer 115" formed in the inner side of the PCB 110".

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for manufacturing a hollow shielding structure for different types of circuit elements, the method comprising:
    loading a printed circuit board (PCB) on which the different types of circuit elements are mounted into a working position;
    calibrating a position of a nozzle with respect to the loaded PCB;
    forming a shield dam on the PCB by discharging a material from the nozzle;
    placing a shield cover in an upper portion of the shield dam to cover the different types of circuit elements; and
    forming an adhesion part which electrically couples the shield dam and the shield cover by applying a conductive material between the shield dam and the shield cover.

2. The method as claimed in claim 1, wherein the calibrating of the position of the nozzle comprises:
    setting a discharge start position of the nozzle by detecting a distortion degree of the PCB on an X-Y plane to a clockwise direction or counterclockwise direction with respect to a preset manufacturing position; and
    setting a gap between a surface of the PCB and an end portion of the nozzle by detecting a distortion degree of the PCB on the X-Y plane to a Z-direction.

3. The method as claimed in claim 1, wherein, after the forming of the adhesion part, the method further comprises:
    removing the adhesion part from the shield dam and the shield cover;
    separating the shield cover from the shield dam;
    removing the shield dam from the PCB; and
    removing a remaining portion of the shield dam attached to the PCB.

* * * * *